US 10,727,370 B2
(45) Date of Patent: Jul. 28, 2020

(12) United States Patent
Na et al.

(10) Patent No.: US 10,727,370 B2
(45) Date of Patent: Jul. 28, 2020

(54) OPTICAL DEVICE INCLUDING THREE-COUPLED QUANTUM WELL STRUCTURE HAVING ASYMMETRIC MULTI-ENERGY LEVELS

(71) Applicant: SAMSUNG ELECTRONICS CO., LTD., Suwon-si (KR)

(72) Inventors: Byunghoon Na, Seoul (KR); Changyoung Park, Suwon-si (KR); Yonghwa Park, Pyeongtaek-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/332,528

(22) Filed: Oct. 24, 2016

(65) Prior Publication Data
US 2017/0200856 A1 Jul. 13, 2017

(30) Foreign Application Priority Data
Jan. 8, 2016 (KR) ........................ 10-2016-0002768

(51) Int. Cl.
*H01L 33/06* (2010.01)
*G02F 1/017* (2006.01)
*H01L 33/04* (2010.01)
*H01L 33/30* (2010.01)
*H01L 33/60* (2010.01)

(52) U.S. Cl.
CPC .......... *H01L 33/06* (2013.01); *G02F 1/01725* (2013.01); *H01L 33/04* (2013.01);
(Continued)

(58) Field of Classification Search
None
See application file for complete search history.

(56) References Cited

U.S. PATENT DOCUMENTS 5,017,974 A * 5/1991 Greene ................. B82Y 20/00
257/14
5,068,867 A 11/1991 Hasenberg et al.
(Continued)

FOREIGN PATENT DOCUMENTS

CN 106980188 A 7/2017
EP 0428913 A2 5/1991
(Continued)

OTHER PUBLICATIONS

Cunningham et al: "Pseudomorphic InGaAsGaAsP quantum well modulators on GaAs", Feb. 10, 1992, Appl. Phys. Lett. vol. 60, No. 6 , pp. 727-729 (4 pages total).
(Continued)

*Primary Examiner* — Abul Kalam
(74) *Attorney, Agent, or Firm* — Sughrue Mion, PLLC

(57) ABSTRACT

Provided is an optical device including an active layer, which includes two outer barriers and a coupled quantum well between the two outer barriers. The coupled quantum well includes a first quantum well layer, a second quantum well layer, a third quantum well layer, a first coupling barrier between the first quantum well layer and the second quantum well layer, and a second coupling barrier between the second quantum well layer and the third quantum well layer. The second quantum well layer is between the first quantum well layer and the third quantum well layer. An energy band gap of the second quantum well layer is less than an energy band gap of the first quantum well layer, and an energy band gap of the third quantum well layer is equal to or less than the energy band gap of the second quantum well layer.

21 Claims, 23 Drawing Sheets

(52) U.S. Cl.
CPC .............. *H01L 33/30* (2013.01); *H01L 33/60* (2013.01); *G02F 2001/01733* (2013.01)

(56) References Cited

U.S. PATENT DOCUMENTS

| | | | |
|---|---|---|---|
| 5,105,301 | A | 4/1992 | Campi |
| 5,416,338 | A * | 5/1995 | Suzuki ................... B82Y 20/00 257/21 |
| 5,937,118 | A | 8/1999 | Komori |
| 6,859,474 | B1 | 2/2005 | Johnson et al. |
| 8,179,585 | B2 | 5/2012 | Nagase et al. |
| 9,082,909 | B2 * | 7/2015 | Cho ................. H01L 31/035209 |
| 9,190,545 | B2 | 11/2015 | Cho et al. |
| 9,417,468 | B2 * | 8/2016 | Park ..................... G02F 1/01716 |
| 9,841,617 | B2 * | 12/2017 | Cho ................. H01L 31/035236 |
| 2006/0279828 | A1 | 12/2006 | Bour et al. |
| 2007/0248131 | A1 * | 10/2007 | Botez ..................... B82Y 20/00 372/43.01 |
| 2008/0093593 | A1 | 4/2008 | Ryu |
| 2008/0101425 | A1 | 5/2008 | Murata et al. |
| 2008/0315179 | A1 * | 12/2008 | Kim ........................ H01L 33/06 257/13 |
| 2010/0245969 | A1 | 9/2010 | Nagase et al. |
| 2011/0101301 | A1 * | 5/2011 | Lin ........................ H01L 33/06 257/13 |
| 2014/0191196 | A1 * | 7/2014 | Cho ................. H01L 31/035209 257/21 |
| 2015/0123077 | A1 * | 5/2015 | Cho ................. H01L 31/035236 257/21 |
| 2015/0286078 | A1 | 10/2015 | Cho et al. |
| 2016/0018676 | A1 * | 1/2016 | Park ..................... G02F 1/01716 385/2 |
| 2016/0320642 | A1 * | 11/2016 | Park ..................... G02F 1/01716 |
| 2017/0200856 | A1 | 7/2017 | Na et al. |

FOREIGN PATENT DOCUMENTS

| | | |
|---|---|---|
| EP | 2927966 A1 | 10/2015 |
| JP | 11109298 A | 4/1999 |
| JP | 2001264711 A | 9/2001 |
| KR | 1020150053156 A | 5/2015 |
| KR | 1020150115535 A | 10/2015 |
| WO | 2008020621 A1 | 2/2008 |

OTHER PUBLICATIONS

Kim et al: "Strained Layer InxGa1—xAs/GaAs and InxGa1—xAs/InyGa1—yP Multiple-Quantum-Well Optical Modulators Grown by Gas-Source MBE" IEEE Photonics Technology Letters, vol. 5, No. 9, Sep. 1993, pp. 987-989 (3 pages total).

Debbar et al: "Coupled GaAs/AlGaAs quantum-well electroabsorption modulators for low-electric-field optical modulation" J. Appl. Phys. 65 (1), Jan. 1, 1989 , pp. 383-385 (4 pages total).

Feng et al: "Field-Induced Optical Effect in a Five-Step Asymmetric Coupled Quantum Well with Modified Potential" IEEE Journal of Quantum Electronics, vol. 34, No. 7, Jul. 1998, pp. 1197-1208 (12 pages total).

Woodward et al. "Comparison of stepped-well and square-well multiple-quantum-well optical modulators" J. Appl. Phys. 78 (3), Aug. 1, 1995, pp. 1411-1414 (4 pages total).

Chan et al: "Field Induced Optical Effects in Coupled Quantum Wells", IEEE Journal of Quantum Electronics, vol. 27, No. 3, Mar. 1991, pp. 702-707 (6 pages total).

Tada et al: "Ultra-Wideband Ultrafast Multiple-Quantum-Well Optical Modulators" Photonics Based on Wavelength Integration and Manipulation, IPAP Books 2 (2005) pp. 199-212, (14 pages total).

Mohseni et al: "Enhanced electro-optic effect in GaInAsP—InP three-step quantum wells" Applied Physics Letters, vol. 84, No. 11, Mar. 15, 2004, pp. 1823-1825 (4 pages total).

Trezza et al: "Large, low-voltage absorption changes and absorption bistability in GaAs/AlGaAs/InGaAs asymmetric quantum wells", J. Appl. Phys. 74 (3), Aug. 1, 1993, pp. 1972-1978 (7 pages total).

Extended Search Report dated May 19, 2017 by the European Patent Office in counterpart International Application No. 16198463.8-1903.

Huang, et al., "Intersubband transitions in triple-coupled quantum wells for three-colors infrared detectors", Journal of Applied Physics, US, vol. 80, No. 10, Nov. 15, 1996 (Nov. 15, 1996), pp. 6045-6049, XP055371075.

Fritz, et al., "Barrier-width dependence of emission in triplequantum-well broadband light-emitting diodes", Electronics Letters, IEE Stevenage, GB, vol. 35, No. 2, Jan. 21, 1999 (Jan. 21, 1999), total 2 pages, XP006011666.

Huang, Yimin et al., "Very large Stark shift in three-coupled-quantum wells and their application to tunable far-infrared photodetectors", Journal of Applied Physics, vol. 77, No. 7, Apr. 1, 1995, pp. 3433-3438, XP55619535. (7 pages total).

Bae, S. -J. et al., "Design of polarization independent InGaAs/InGaAlAs coupled quantum well structure in 1.55 um wavelength region", Optical and Quantum Electronics, vol. 35, No. 10, Jan. 1, 2003, pp. 967-977, XP55619810. (11 pages total).

Communication dated Sep. 13, 2019 by the European Patent Office in counterpart European Patent Application No. 16198463.8.

Communication dated May 15, 2020 from the European Patent Office in application No. 16198463.8.

* cited by examiner

OPTICAL DEVICE INCLUDING THREE-COUPLED QUANTUM WELL STRUCTURE HAVING ASYMMETRIC MULTI-ENERGY LEVELS

CROSS-REFERENCE TO RELATED APPLICATION

This application claims priority from Korean Patent Application No. 10-2016-0002768, filed on Jan. 8, 2016, in the Korean Intellectual Property Office, the disclosure of which is incorporated herein in its entirety by reference.

BACKGROUND

1. Field

Devices consistent with exemplary embodiments relate to optical devices including a three-coupled quantum well structure, and more particularly, to optical devices including a three-coupled quantum well structure having asymmetric multi-energy levels, in which a driving voltage of the three-coupled quantum well structure may be reduced while maintaining a high light absorption intensity.

2. Description of the Related Art

Three-dimensional (3D) cameras may measure a distance to multiple points on a surface of an object. Various algorithms have been proposed to measure a distance between an object and a 3D camera, and a time-of-flight (TOF) algorithm is widely used. According to the TOF algorithm, an illumination light is irradiated to an object and then a TOF taken by the illumination light reflected from the object to be received by a light-receiving unit is measured. The TOF of the illumination light may be obtained by measuring a phase delay of the illumination light, and an optical modulator is used to measure the phase delay.

SUMMARY

One or more exemplary embodiments provide an optical device including a three-coupled quantum well structure having asymmetric multi-energy levels, in which a driving voltage of the three-coupled quantum well structure is reduced while maintaining a high light absorption intensity.

Additional aspects will be set forth in part in the description which follows and, in part, will be apparent from the description, or may be learned by practice of the exemplary embodiments.

According to an aspect of an exemplary embodiment, there is provided an optical device including an active layer, the active layer including two outer barriers and a coupled quantum well between the two outer barriers. The coupled quantum well includes a first quantum well layer, a second quantum well layer, a third quantum well layer, a first coupling barrier between the first quantum well layer and the second quantum well layer, and a second coupling barrier between the second quantum well layer and the third quantum well layer. The second quantum well layer is between the first quantum well layer and the third quantum well layer, and an energy band gap of the second quantum well layer is less than an energy band gap of the first quantum well layer, and an energy band gap of the third quantum well layer is equal to or less than the energy band gap of the second quantum well layer.

For example, the energy band gap of the third quantum well layer may be less than the energy band gap of the second quantum well layer.

A thickness of the first quantum well layer and a thickness of the third quantum well layer may be less than a thickness of the second quantum well layer.

The thickness of the first quantum well layer may be equal to the thickness of the third quantum well layer.

For example, the thickness of the first quantum well layer and the thickness of the third quantum well layer may be in a range from about 1 nm to about 2 nm, and a thickness of the second quantum well layer may be in a range from about 4 nm to about 8 nm.

An energy band gap of the first coupling barrier and an energy band gap of the second coupling barrier may be greater than energy band gaps of the first, second, and third quantum well layers and may be less than an energy band gap of an outer barrier.

A thickness of the first coupling barrier may allow tunneling of an electron and a hole through the first coupling barrier and a thickness of the second coupling barrier may allow the tunneling of the electron and the hole through the second coupling barrier.

For example, a thickness of the first coupling barrier and a thickness of the second coupling barrier may be about in a range from 1 nm to about 3 nm.

The first quantum well layer may include $Al_zGa_{1-z}As$ (0<z<1), the second quantum well layer may include GaAs, the third quantum well layer may include $In_xGa_{1-x}As$ (0≤x≤0.2), the first and second coupling barriers may include $Al_yGa_{1-y}As$ (y<1), and an outer barrier may include $Al_xGa_{1-x}As$ (x≤1), wherein z<y<x.

The first, second, and third quantum well layers may include $In_xGa_{1-x}As$ (0<x≤0.2), the first and second coupling barriers may include GaAs, and an outer barrier may include at least one of $GaAs_yP_{1-y}$ and $In_yGa_{1-y}P$ (0.4≤y≤0.5).

The optical device may further include a substrate, in which each of the first, second, and third quantum well layers may include a material having a compressive strain with respect to the substrate, and an outer barrier may include a material having a tensile strain with respect to the substrate.

For example, a value of a composition ratio (x) of the first quantum well layer may be less than a value of a composition ratio (x) of the second quantum well layer and a value of a composition ratio (x) of the third quantum well layer, and the value of the composition ratio (x) of the second quantum well layer and the value of the composition ratio (x) of the third quantum well layer may be equal to each other.

A value of a composition ratio (x) of the first quantum well layer may be less than a value of a composition ratio (x) of the second quantum well layer, and the value of the composition ratio (x) of the second quantum well layer may be less than a value of a composition ratio (x) of the third quantum well layer.

The first, second, and third quantum well layers may include at least one of $In_{1-x}Ga_xAs$ and $In_{1-x-y}Ga_xAl_yAs$, the first and second coupling barriers may include at least one of $In_{1-x'-y'}Ga_{x'}Al_{y'}As$ (x'<x, y<y') and $In_{1-x}Ga_xAs_zP_{1-z}$ (x'<x), an outer barrier may include at least one of $In_{1-x''-y'}Ga_{x''}Al_{y'}As$ (x''<x'<x, y<y'<y'') and $In_{1-x''}Ga_{x''}As_zP_{1-z'}$ (x''<x'<x, z<z'), and 0<x, y, z<1.

The optical device may further include a lower reflective layer under the active layer and doped in a first conductive type and an upper reflective layer on the active layer and doped in a second conductive type that is electrically opposite to the first conductive type.

The optical device may further include at least one micro cavity layers in at least one of the upper reflective layer and the upper reflective layer, and when a resonance wavelength of the optical device is λ, an optical thickness of the active layer and an optical thickness of the at least one micro cavity layers may be each an integral multiple of λ/2.

The optical device may include a reflective optical modulator, and a reflectance of the lower reflective layer may be greater than a reflectance of the upper reflective layer.

For example, the optical device may include a transmissive optical modulator, and a reflectance of the lower reflective layer may be equal to a reflectance of the upper reflective layer.

For example, the active layer may include a first active layer and a second active layer.

The optical device may further include a lower reflective layer under the first active layer and doped in a first conductive type, an intermediate reflective layer between the first active layer and the second active layer and doped in a second conductive type that is electrically opposite to the first conductive type, and an upper reflective layer on the second active layer and doped in the first conductive type.

A thickness of the second quantum well layer of the coupled quantum well of the first active layer may be different from a thickness of the second quantum well layer of the coupled quantum well of the second active layer.

An energy band gap of the third quantum well layer may be equal to an energy band gap of the second quantum well layer in the first active layer, and the energy band gap of the third quantum well layer may be less than the energy band gap of the second quantum well layer in the second active layer.

A band gap of the first quantum well layer may be in a range from about 1.5 eV to about 1.2 eV, a band gap of the second quantum well layer may be in a range from about 1.3 eV to about 1.1 eV, and a band gap of the third quantum well layer may be about 1.3 eV or less.

According to an aspect of another exemplary embodiment, there is provided an optical device including an active layer, the active layer including two outer barriers and a coupled quantum well between the two outer barriers. The coupled quantum well includes a second quantum well layer, a third quantum well layer, a first coupling barrier between the first quantum well layer and the second quantum well layer, and a second coupling barrier between the second quantum well layer and the third quantum well layer. An energy band gap of the first coupling barrier and an energy band gap of the second coupling barrier are greater than energy band gaps of the first, second, and third quantum well layers and are less than an energy band gap of an outer barrier. The first quantum well layer has a first energy band gap, the second quantum well layer has a second energy band gap less than the first energy band gap, and the third quantum well layer has a third energy band gap less than the first energy band gap.

The third energy band gap of the third quantum well layer may be less than the second energy band gap.

According to an aspect of still another exemplary embodiment, there is provided an optical device including an active layer, the active layer including a first outer barrier, a second outer barrier, and a three-coupled quantum well between the first outer barrier and the second outer barrier. The three-coupled quantum well includes a first quantum well layer, a second quantum well layer, a third quantum well layer, a first coupling barrier between the first quantum well layer, and a second coupling barrier between the second quantum well layer and the third quantum well layer. The second quantum well layer is between the first quantum well layer and the third quantum well layer. An energy band gap of the second quantum well layer is less than an energy band gap of the first quantum well layer, and an energy band gap of the third quantum well layer is equal to or less than the energy band gap of the second quantum well layer. A thickness of the first quantum well layer and a thickness of the third quantum well layer are less than a thickness of the second quantum well layer.

BRIEF DESCRIPTION OF THE DRAWINGS

The above and/or other aspects will be more apparent by describing certain exemplary embodiments with reference to the accompanying drawings, in which.

DETAILED DESCRIPTION

Figure 1:
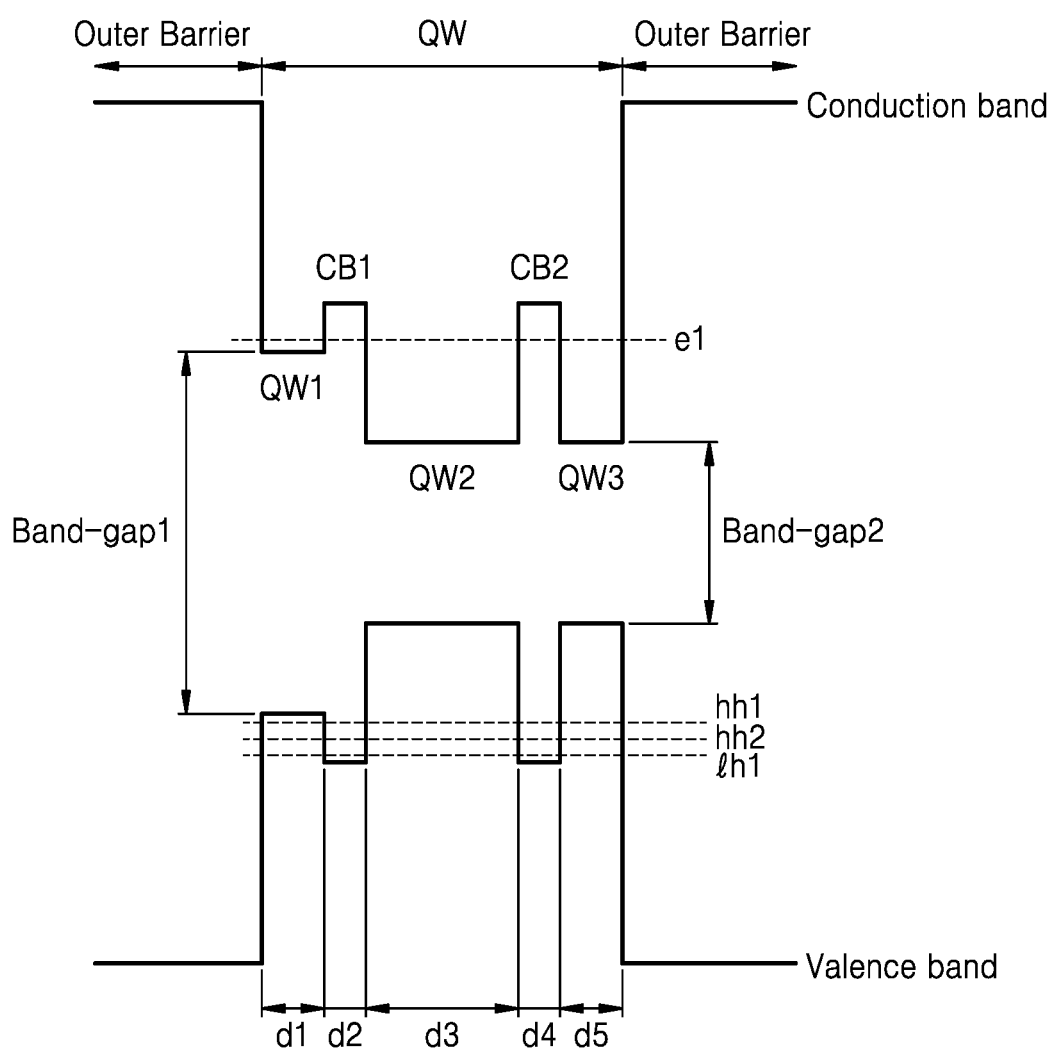
FIG. 1 is a schematic energy band diagram of an active layer including a three-coupled quantum well structure according to an exemplary embodiment.

Certain exemplary embodiments will now be described more fully with reference to the accompanying drawings, wherein like reference numerals refer to like elements throughout. The exemplary embodiments may have different forms and should not be construed as being limited to the descriptions set forth herein. Accordingly, the embodiments are merely described below, by referring to the figures, to explain aspects. Expressions such as "at least one of," when preceding a list of elements, modify the entire list of elements and do not modify the individual elements of the list.

Hereinafter, an optical device including a three-coupled quantum well structure having asymmetric multi-level energy will be described in detail with reference to the accompanying drawings. Throughout the drawings, like reference numerals refer to like elements, and a size of each element may be exaggerated for clarity and convenience of a description. The following embodiments are merely examples, and an expression "above" or "on" may include not only immediately on/under/left/right, but also on/under/left/right in a non-contact manner.

FIG. 1 is a schematic energy band diagram of an active layer including a three-coupled quantum well structure according to an exemplary embodiment. In particular, FIG. 1 is an energy band diagram of an active layer when a voltage or an electric field is not applied to the active layer.

Referring to FIG. 1, an active layer according to an exemplary embodiment may include two outer barriers and a three-coupled quantum well QW disposed between the two outer barriers. Although two outer barriers and one three-coupled quantum well QW are illustrated in FIG. 1 for convenience of explanation, any number of outer barriers and three-coupled quantum wells may be included in the active layer.

The three-coupled quantum well QW may include a first quantum well layer QW1, a first coupling barrier CB1, a second quantum well layer QW2, a second coupling barrier CB2, and a third quantum well layer QW3, which are arranged sequentially in that order. In a three-coupled quantum well structure, the first, second, and third quantum well layers QW1, QW2, and QW3 are coupled to one another through the first and second coupling barriers CB1 and CB2.

To couple the first, second, and third quantum well layers QW1, QW2, and QW3 disposed between the two outer barriers, the first and second coupling barriers CB1 and CB2 may have a smaller thickness and a lower energy level than those of the outer barriers as shown in FIG. 1. For example, in a conduction band shown in an upper portion of the energy band diagram of FIG. 1, energy levels of the first and second coupling barriers CB1 and CB2 are higher than a ground level (or an energy level of a first electron e1) and are lower than energy levels of the outer barriers.

Similarly, in a valence band shown in a lower portion of the energy band diagram of FIG. 1, the energy levels of the first and second coupling barriers CB1 and CB2 are higher than a ground level (or an energy level of a first heavy hole hh1) and are lower than the energy levels of the outer barriers. The energy levels of the first and second coupling barriers CB1 and CB2 are higher than an energy level of a second heavy hole, hh2, and an energy level of a first light hole lh1. The first and second coupling barriers CB1 and CB2 are formed to have a thickness that is small enough to allow tunneling of electrons and holes therethrough. For example, a thickness d2 of the first coupling barrier CB1 and a thickness d4 of the second coupling barrier CB2 may be equal to or less than a thickness d1 of the first quantum well layer QW1 and a thickness d5 of the third quantum well layer QW3. For example, the thicknesses d2 and d4 of the first and second coupling barriers CB1 and CB2 may be about 1 nm to about 3 nm.

Generally, when a wave function of holes and a wave function of electrons overlap to a large extent, generation of an exciton that is a pair of electrons and holes increases, which increases a light absorption intensity of an optical device. According to an exemplary embodiment, the second quantum well layer QW2 is formed to have the largest thickness to increase portions of the wave function of electrons and holes remaining in the second quantum well layer QW2, thereby increasing an overlap between the wave function of the electrons and the wave function of the holes. Hence, the light absorption intensity of the optical device may be improved. In other words, the thicknesses d1 and d5 of the first and third quantum well layers QW1 and QW3 disposed in opposite ends may be smaller than the thickness d3 of the second quantum well layer QW2 disposed between the first and third quantum well layers QW1 and QW3.

On the other hand, when the thicknesses d1 and d5 of the first and third quantum well layers QW1 and QW3 are excessively small, a driving voltage may increase and a precise processing control may be required in a manufacturing process. In consideration of this, the thicknesses d1, d3, and d5 of the first, second, and third quantum well layers QW1, QW2, and QW3 may be determined. For example, the thicknesses d1 and d5 of the first and third quantum well layers QW1 and QW3 may be about 1 nm to about 2 nm, and the thickness d3 of the second quantum well layer QW2 may be about 4 nm to about 8 nm. The thickness d2 of the first quantum well layer QW1 and the thickness d5 of the third quantum well layer QW3 may be equal to or different from each other.

The energy levels of the first, second, and third quantum well layers QW1, QW2, and QW3 are lower than the ground level of the first electron e1. In particular, the energy level of the second quantum well layer QW2 is lower than that of the first quantum well layer QW1, and the energy levels of the second quantum well layer QW2 and the third quantum well layer QW3 may be equal to each other. Thus, a band gap, Band-gap1, of the first quantum well layer QW1 is larger than a band gap, Band-gap2, of the second quantum well layer QW2, and the second quantum well layer QW2 and the third quantum well layer QW3 may have the same band gap as Band-gap2. The first, second, and third quantum well layers QW1, QW2, and QW3 have two different energy levels and asymmetric energy level distributions such that the three-coupled quantum well QW according to an exemplary has asymmetric multi-level energy.

When the energy level of the second quantum well layer QW2 is lower than that of the first quantum well layer QW1, strong light absorption may occur in the second quantum well layer QW2. In addition, as the second quantum well layer QW2 and the third quantum well layer QW3 have the same energy level, the wave function of the first heavy hole hh1 may be more easily and intensively distributed in the second quantum well layer QW2 and the third quantum well layer QW3. As a result, the driving voltage of the optical device including the active layer shown in FIG. 1 may be reduced while maintaining a high light absorption intensity.

Materials of the first, second, and third quantum well layers QW1, QW2, and QW3, the first and second coupling barriers CB1 and CB2, and the outer barriers which satisfy the above conditions may be variously determined depending on a wavelength band to be used. For example, for an infrared region of about 850 nm, $Al_zGa_{1-z}As$ (0<z<1) may be used for the first quantum well layer QW1, GaAs may be used for the second and third quantum well layers QW2 and QW3, $Al_yGa_{1-y}As$ (y<1) may be used for the first and second coupling barriers CB1 and CB2, and $Al_xGa_{1-x}As$ (x≤1) may be used for the outer barriers. Here, for example, the composition ratios satisfy z<y<x. In this case, materials of the first, second, and third quantum well layers QW1, QW2, and QW3 and the first and second coupling barriers CB1 and CB2 have the same lattice parameter as a GaAs substrate such that strain may not occur with respect to the GaAs substrate.

When an infrared region of about 900 nm to about 1050 nm is used, $In_xGa_{1-x}As$, which has compressive strain with respect to the GaAs substrate, may be used for the first, second, and third quantum well layers QW1, QW2, and QW3, and $GaAs_{1-y}P_y$ or $In_yGa_{1-y}P$ (0<x≤0.2, and 0.4≤y≤0.5), which has tensile strain with respect to the GaAs substrate, may be used for the outer barriers. In particular, a value of a composition ratio (x) of the first quantum well layer QW1 may be less than values of a composition ratio (x) of the second quantum well layer QW2 and a composition ratio (x) of the third quantum well layer QW3, wherein the values of the composition ratio (x) of the second quantum well layer QW2 and the composition ratio (x) of the third quantum well layer QW3 are equal to each other. By using a material having compressive strain with respect to the first, second, and third quantum well layers QW1, QW2, and QW3 and using a material having tensile strain with respect to the outer barriers, stress may be compensated for. With respect to the first coupling barrier CB1 and the second coupling barrier CB2, GaAs having the same lattice parameter as the substrate may be used.

In a middle infrared region of about 1550 nm, combinations of various materials may be used such as $In_{1-x}Ga_xAs$ and $In_{1-x-y}Ga_xAl_y$ (0<x, y, z<1). As for the first, second, and third quantum well layers QW1, QW2, and QW3, $In_{1-x'-y'}Ga_{x'}Al_{y'}As$ (x'<x, y<y') and $In_{1-x}Ga_xAs_zP_{1-z}$ (x'<x) for the first coupling barrier CB1 and the second coupling barrier CB2, and $In_{1-x''-y''}Ga_{x''}Al_{y''}As$ (x"<x'<x, y<y'<y") and $In_{1-x''}Ga_{x''}As_{z'}P_{1-z'}$ (x"<x'<x, z<z') for the outer barriers. In this case, InP may be used for the substrate, and materials of the first, second, and third quantum well layers QW1, QW2, and QW3, and the outer barriers may be selected such that the first, second, and third quantum well layers QW1, QW2, and QW3 have compressive strain with respect to the InP substrate and the outer barriers have tensile strain with respect to the InP substrate.

Upon application of a reverse bias voltage to opposite ends of the active layer structured as described above, a multi-quantum well structure forms excitons in a particular wavelength band to absorb light. An absorption spectrum of a multi-quantum well structure moves toward a longer wavelength as the reverse bias voltage increases such that the degree of absorption at a particular wavelength may change with the reverse bias voltage. According to the above principle, by controlling the reverse bias voltage, the intensity of incident light having a particular wavelength may be modulated.

When modulating the intensity of the incident light, it is desirable to increase a contrast ratio, indicating a difference in an absorption degree between when a voltage is applied and when a voltage is not applied, and reduce a driving voltage to prevent performance degradation caused by heat emission.

The contrast ratio may be increased by increasing a light absorption intensity and a transition energy in the multi-quantum well structure. The light absorption intensity is inversely proportional to a thickness of a quantum well layer and is proportional to the square of a degree to which a wave function of holes in a quantum well layer and a wave function of electrons in the quantum well layer overlap each other. The transition energy indicating a degree to which the absorption spectrum is moved toward a longer wavelength is proportional to the fourth power of a thickness of a quantum well layer and is proportional to the square of an applied voltage. Thus, when the thickness of the quantum well layer is reduced to increase the light absorption intensity, the transition energy is reduced, and as a result, the applied voltage may increase to compensate for the reduction of the transition energy. On the other hand, when the thickness of the quantum well layer increases to increase the transition energy, the degree to which the wave function of the holes and the wave function of the electrons overlap each other decreases, thereby reducing generation of excitons caused by electron-hole pairs and thus reducing absorption intensity.

In the active layer according to the exemplary embodiment shown in FIG. 1, the first, second, and third quantum well layers QW1, QW2, and QW3 are connected to each other through the first coupling barrier CB1 and the second coupling barrier CB2, respectively, and the wave function of the electrons and the wave function of the holes may be distributed across the first, second, and third quantum well layers QW1, QW2, and QW3 beyond the first coupling barrier CB1 and the second coupling barrier CB2. Thus, in an overall structure of the active layer, the three-coupled quantum well QW may function in a manner similar to one quantum well. As a result, a total thickness of a three-coupled quantum well structure that operates as one quantum well layer is larger than a thickness of one quantum well, and thus transition energy may be increased without increasing a driving voltage.

Figure 2A:
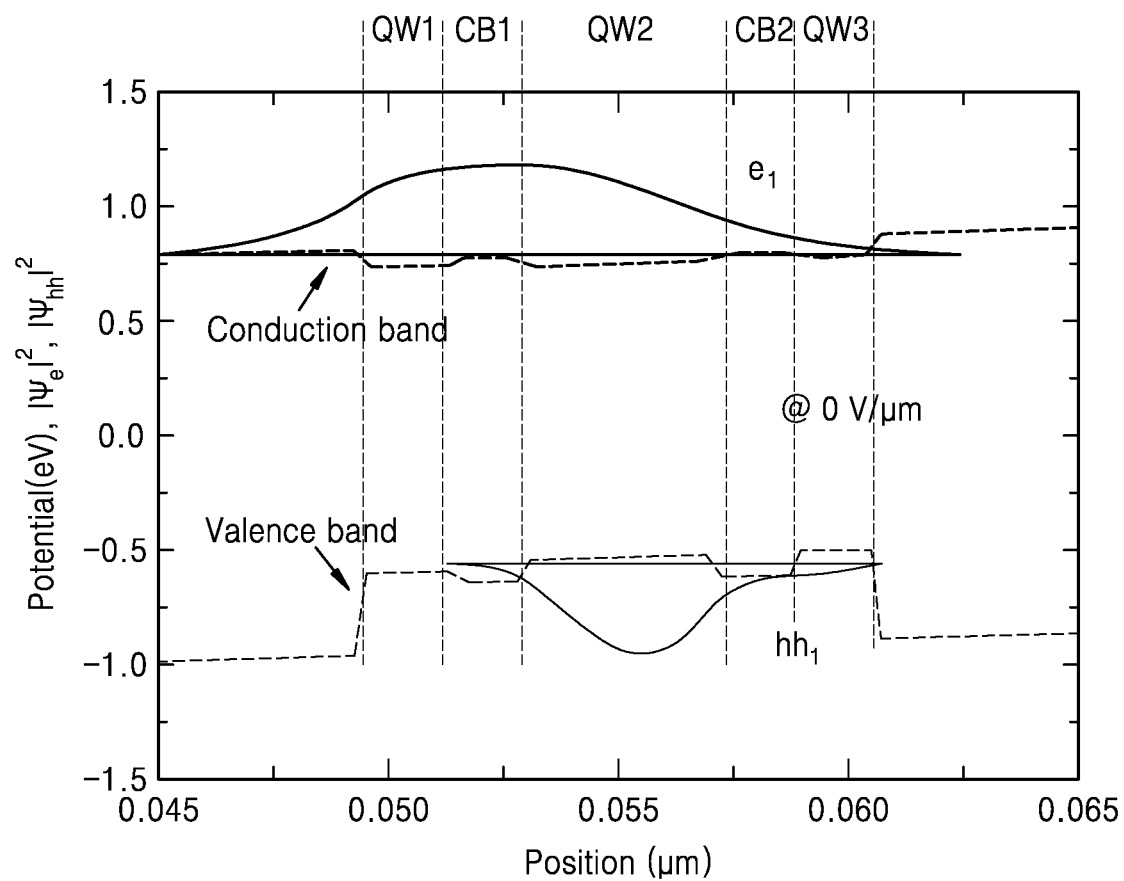
FIGS. 2A, 2B, and 2C are graphs respectively showing changes in a wave function of electrons and a wave function of holes with respect to a voltage applied to an active layer shown in FIG. 1.
Figure 2B:
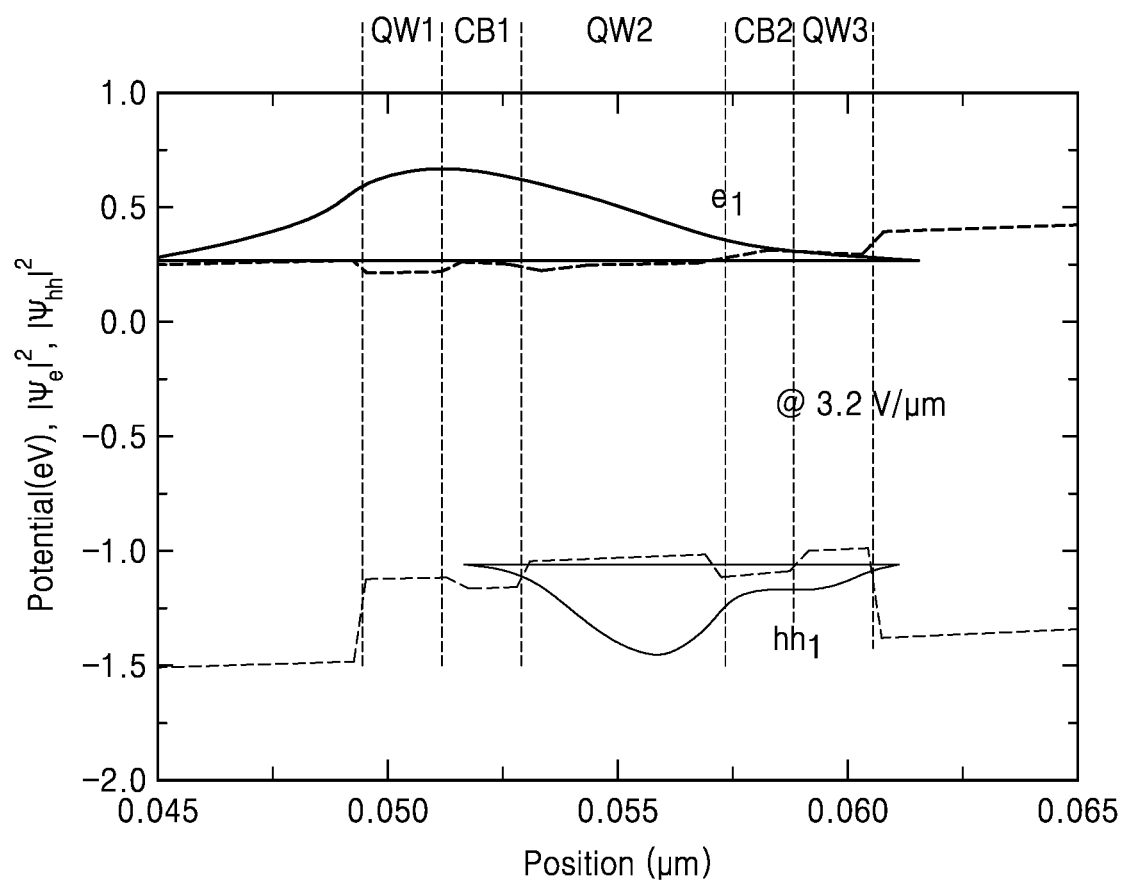
Figure 2C:
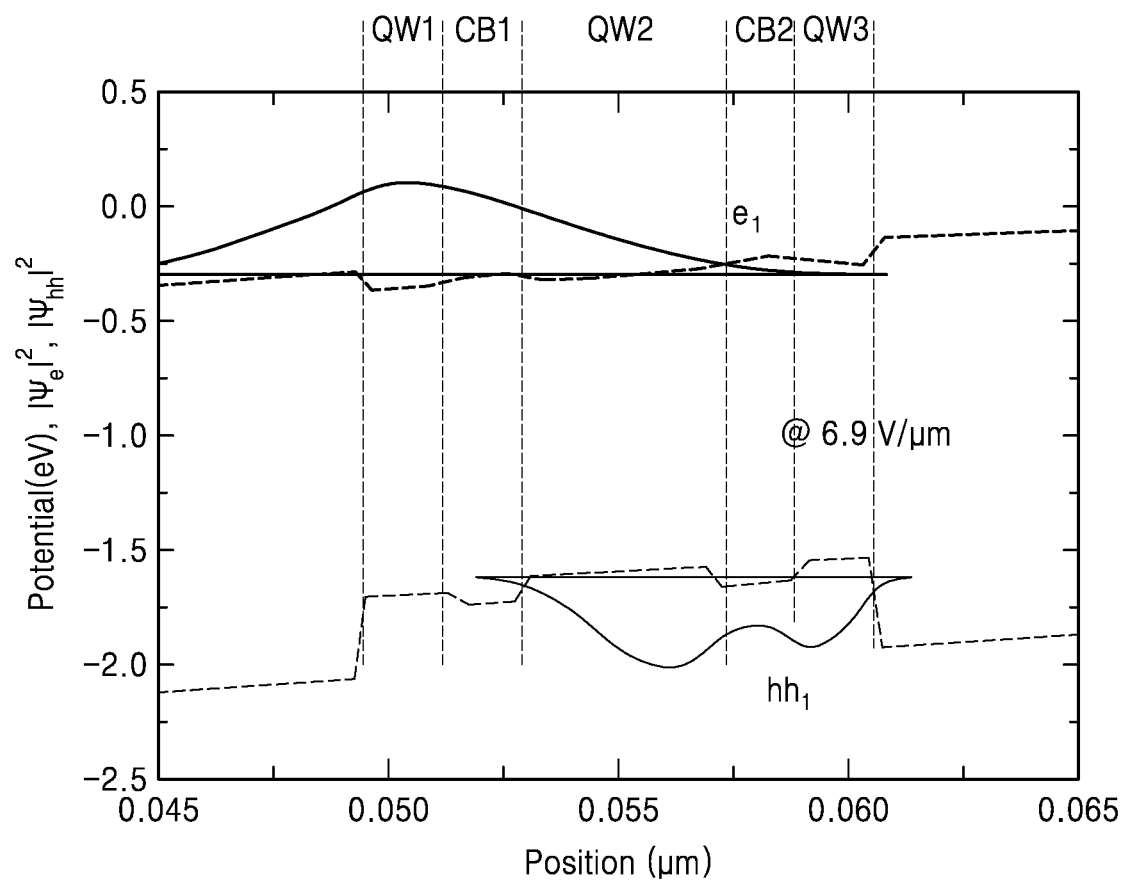

FIGS. 2A, 2B, and 2C are graphs respectively showing changes in a wave function of electrons and a wave function of holes with respect to a voltage applied to the active layer shown in FIG. 1. In FIGS. 2A through 2C, $IN_{0.08}GaAs$ is used for the first quantum well layer QW1, $In_{0.137}GaAs$ is used for the second quantum well layer QW2 and the third quantum well layer QW3, and GaAs is used for the first coupling barrier CB1 and the second coupling barrier CB2.

FIG. 2A illustrates a wave function of electrons and a wave function of holes when a reverse bias voltage is not applied to the active layer shown in FIG. 1. Referring to FIG. 2A, a wave function of the first electron e1 is distributed over the first, second, and third quantum well layers QW1, QW2, and QW3, and mainly in the second quantum well layer QW2. A second electron e2 may not form a wave function because energy level differences between the first and second coupling barriers CB1 and CB2 and the first, second, and third quantum well layers QW1, QW2, and QW3 are small and thus, the second electron e2 is not confined to the first, second, and third quantum well layers QW1, QW2, and QW3. A wave function of the first heavy hole hh1 is distributed across the first, second, and third quantum well layers QW1, QW2, and QW3. The wave function of the first heavy hole hh1 is distributed mainly in the center of the second quantum well layer QW2. Thus, in an initial state (e.g., 0 V/μm), the wave function of the first electron e1 is distributed widely across the first, second, and third quantum well layers QW1, QW2, and QW3 and the wave function of the first heavy hole hh1 is distributed around the second quantum well layer QW2.

On the other hand, upon application of the reverse bias voltage to the active layer, the energy band of the three-coupled quantum well QW is inclined such that the wave function of the first electron e1 moves toward the first quantum well layer QW1 beyond the first coupling barrier CB1, and the wave function of the first heavy hole hh1 having electric charges opposite to the electron moves toward the third quantum well layer QW3 beyond the second coupling barrier CB2. For example, FIG. 2B illustrates a wave function of electrons and a wave function of holes when a reverse bias voltage of 3.2 V/μm is applied to the active layer, and FIG. 2C illustrates a wave function of electrons and a wave function of holes when a reverse bias voltage of 6.9 V/μm is applied to the active layer. Referring to FIGS. 2B and 2C, when the applied revise bias voltage increases, the energy band of the three-coupled quantum well QW is inclined at a greater degree such that the wave function of the first electron e1 moves further toward the first quantum well layer QW1 and the wave function of the first heavy hole hh1 moves further toward the third quantum well layer QW3.

In particular, a band gap of the third quantum well layer QW3 is smaller than that of the first quantum well layer QW1 such that the first heavy hole hh1 moves fast toward the third quantum well layer QW3 and thus, a degree to which the first heavy hole hh1 is confined to the third quantum well layer QW3 may increase.

Figure 3:
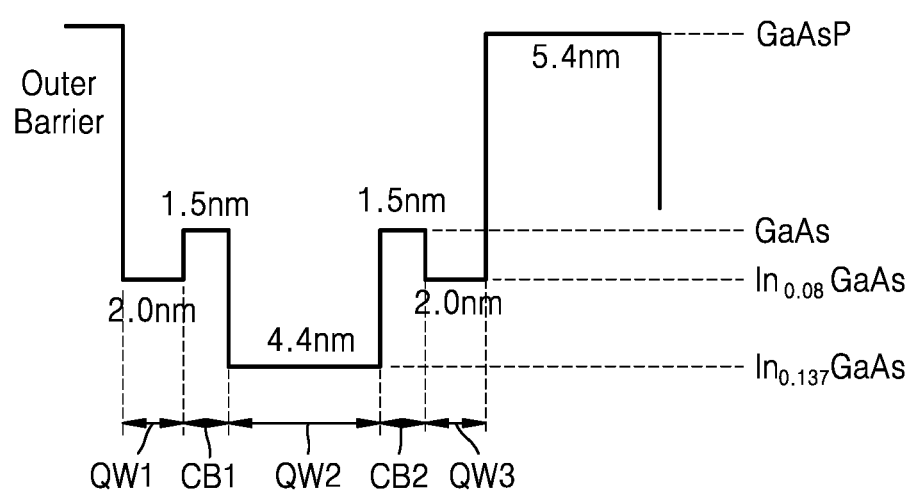
FIG. 3 illustrates a conduction band in an energy band diagram of an active layer according to a comparative example.
Figure 4:
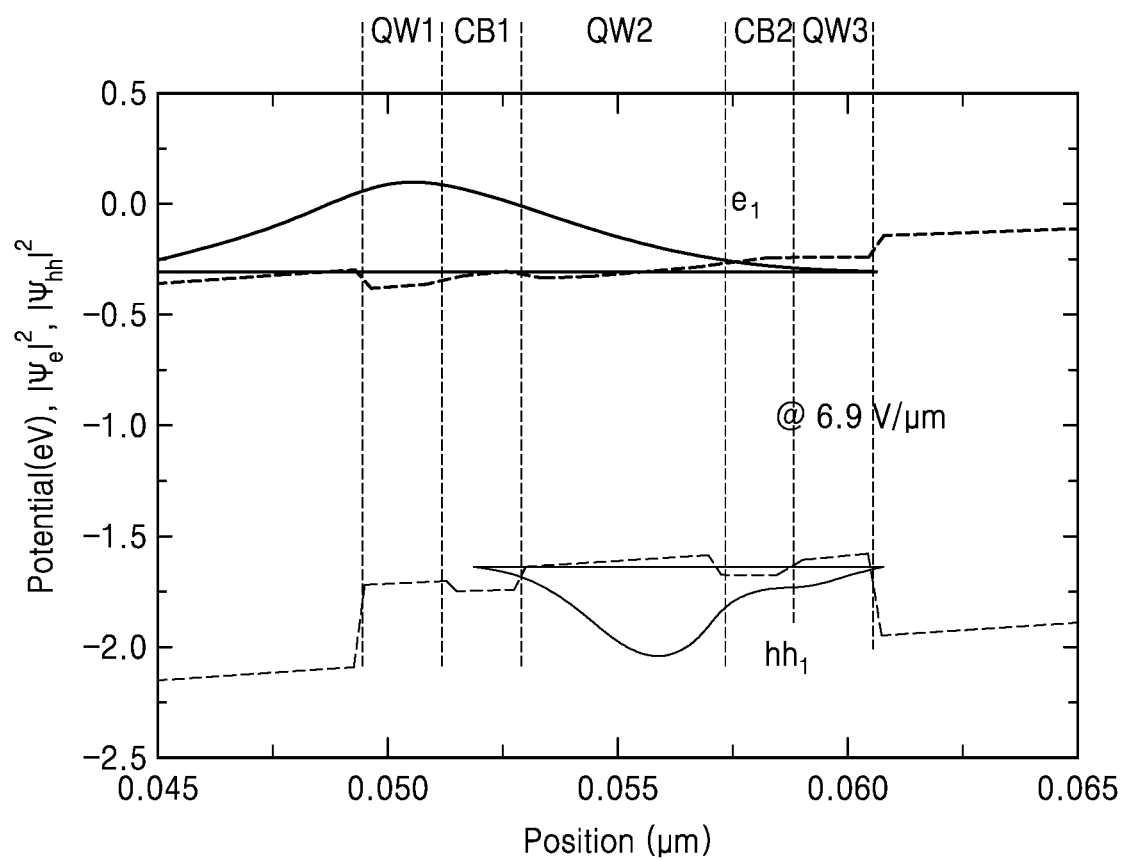
FIG. 4 is a graph showing a wave function of electrons and a wave function of holes in an active layer according to a comparative example illustrated in FIG. 3.

FIG. 3 illustrates a conduction band in an energy diagram according to a comparative example, and FIG. 4 illustrates a graph showing a wave function of electrons and a wave function of holes in an active layer according to the comparative example shown in FIG. 3.

As shown in FIG. 3, the active layer according to the comparative example has a symmetric three-coupled quantum well structure in which the band gap of the second quantum well layer QW2 is smallest and the band gaps of the first quantum well layer QW1 and the third quantum well layer QW3 are equal to each other. In the comparative example of FIG. 3, $In_{0.08}GaAs$ is used for the first quantum well layer QW1 and the third quantum well layer QW3, $In_{0.137}GaAs$ is used for the second quantum well layer QW2, and GaAs is used for the first coupling barrier CB1 and the second coupling barrier CB2. Compared with the graph of FIG. 4, the first heavy hole hh1 is more confined to the third quantum well layer QW3 in response to the same level of the applied voltage of 6.9 V/μm according to the exemplary embodiment. Thus, the first heavy hole hh1 may sufficiently move toward the third quantum well layer QW3 at a lower voltage such that a driving voltage for an optical device including an active layer according to the exemplary embodiment may be lowered.

Even when a voltage is applied, a majority portion of the wave function of the first electron e1 and a majority portion of the wave function of the first heavy hole hh1 remain in the second quantum well layer QW2 having a larger thickness. As described above, when the degree to which the wave function of the holes and the wave function of the electrons overlap each other is large, generation of excitons corresponding to the pairs of the electrons and the holes increases such that the light absorption intensity of the optical device increases. As shown in FIGS. 2A through 2C, since the majority portion of the wave function of the first electron $e_1$ and the majority portion of the wave function of the first heavy hole $hh_1$ remain in the second quantum well layer QW2 having a larger thickness even when the applied voltage increases, the degree to which the wave function of the first electron e1 and the wave function of the first heavy hole hh1 overlap each other may be large. Thus, according to the exemplary embodiment, high absorption and low voltage characteristics of the optical device may be achieved.

Figure 5:
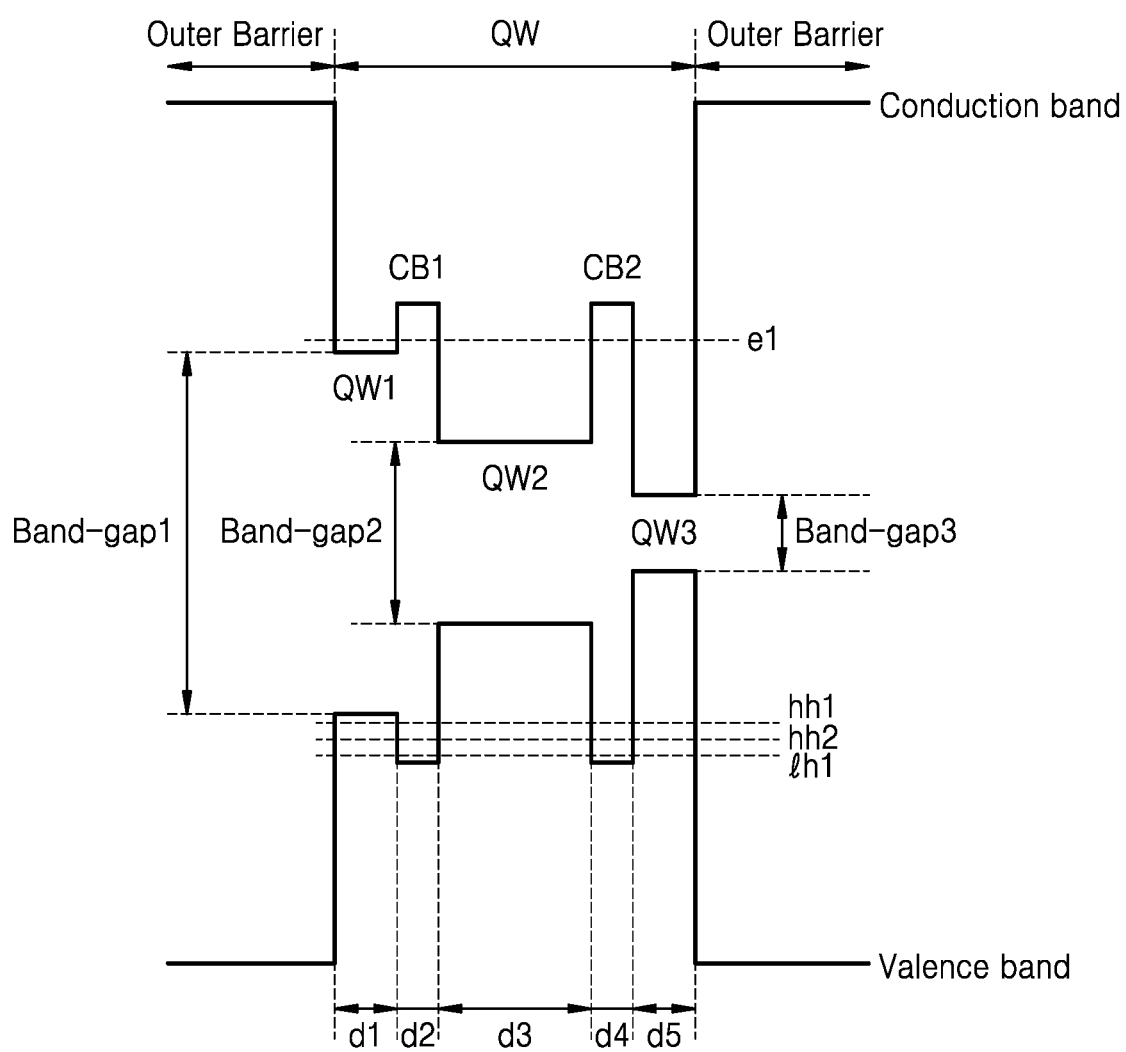
FIG. 5 is a schematic energy band diagram of an active layer including a three-coupled quantum well structure according to another exemplary embodiment.

FIG. 5 is a schematic energy band diagram of an active layer including a three-coupled quantum well structure according to another exemplary embodiment. In particular, FIG. 5 is the energy band diagram when a voltage or an electric field is not applied to the active layer. A basic structure of the active layer shown in FIG. 5 is similar to that of the active layer shown in FIG. 1 except for a relationship between energy levels of the first, second, and third quantum well layers QW1, QW2, and QW3. For example, the energy levels of the first, second, and third quantum well layers QW1, QW2, and QW3 are lower than the ground level. In particular, the energy level of the second quantum well layer QW2 is lower than that of the first quantum well layer QW1, and the energy level of the third quantum well layer QW3 is lower than that of the second quantum well layer QW2. In other words, the energy level decreases from the first quantum well layer QW1 to the third quantum well layer QW3. Thus, the band gap, Band-gap1, of the first quantum well layer QW1 is larger than the band gap, Band-gap2, of the second quantum well layer QW2, and the band gap, Band-gap2, of the second quantum well layer QW2 is larger than the band gap, Band-gap3, of the third quantum well layer QW3. Accordingly, the first, second, and third quantum well layers QW1, QW2, and QW3 have three different energy levels and have an asymmetric energy level distribution, and thus, the three-coupled quantum well QW according to the exemplary embodiment has asymmetric multi-level energy.

For example, when infrared light having a wavelength of about 940 nm is modulated, the band gaps of the first, second, and third quantum well layers QW1, QW2, and QW3 may be selected to satisfy conditions such as the band gap of the first quantum well layer QW1 in a range from about 1.5 eV to about 1.2 eV, the band gap of the second quantum well layer QW2 in a range from about 1.3 eV to about 1.1 eV, and the band gap of the third quantum well layer QW3 about 1.3 eV. However, the band gaps of the first, second, and third quantum well layers QW1, QW2, and QW3 may vary with a use wavelength and materials used in the first, second, and third quantum well layers QW1, QW2, and QW3, and thus the band gaps of the first to third quantum well layers QW1-QW3 are not limited to the aforementioned ranges.

The materials used in the first and second quantum well layers QW1 and QW2 that satisfy the aforementioned conditions may be the same as described with reference to FIG. 1, and a material used in the third quantum well layer QW3 may have an energy level lower than that of the second quantum well layer QW2. For example, in the infrared region of about 850 nm, $Al_zGa_{1-z}As$ (0<z<1) may be used for the first quantum well layer QW1, GaAs may be used for the second quantum well layer QW2, and $In_xGa_{1-x}As$ (0<x≤0.2) may be used for the third quantum well layer QW3. For the infrared region from about 900 nm to about 1050 nm, $In_xGa_{1-x}As$ (0<x≤0.2) may be used for the first, second, and third quantum well layers QW1, QW2, and QW3. Herein, a value of a composition ratio (x) of indium (In) in the first quantum well layer QW1 is smaller than a value of the composition ratio (x) of indium (In) in the second quantum well layer QW2, and the value of the composition ratio (x) of indium (In) in the second quantum well layer QW2 is smaller than a value of the composition ratio (x) of indium (In) in the third quantum well layer QW3. In the middle infrared range of 1550 nm, $In_{1-x}Ga_xAs$ and $In_{1-x-y}Ga_xAl_yAs$ may be used for the first, second, and third quantum well layers QW1, QW2, and QW3, where 0<x, and y<1, and the materials may be selected such that the amount of indium (In) is smallest in the first quantum well layer QW1 and the amount of indium (In) is largest in the third quantum well layer QW3.

Figure 6A:
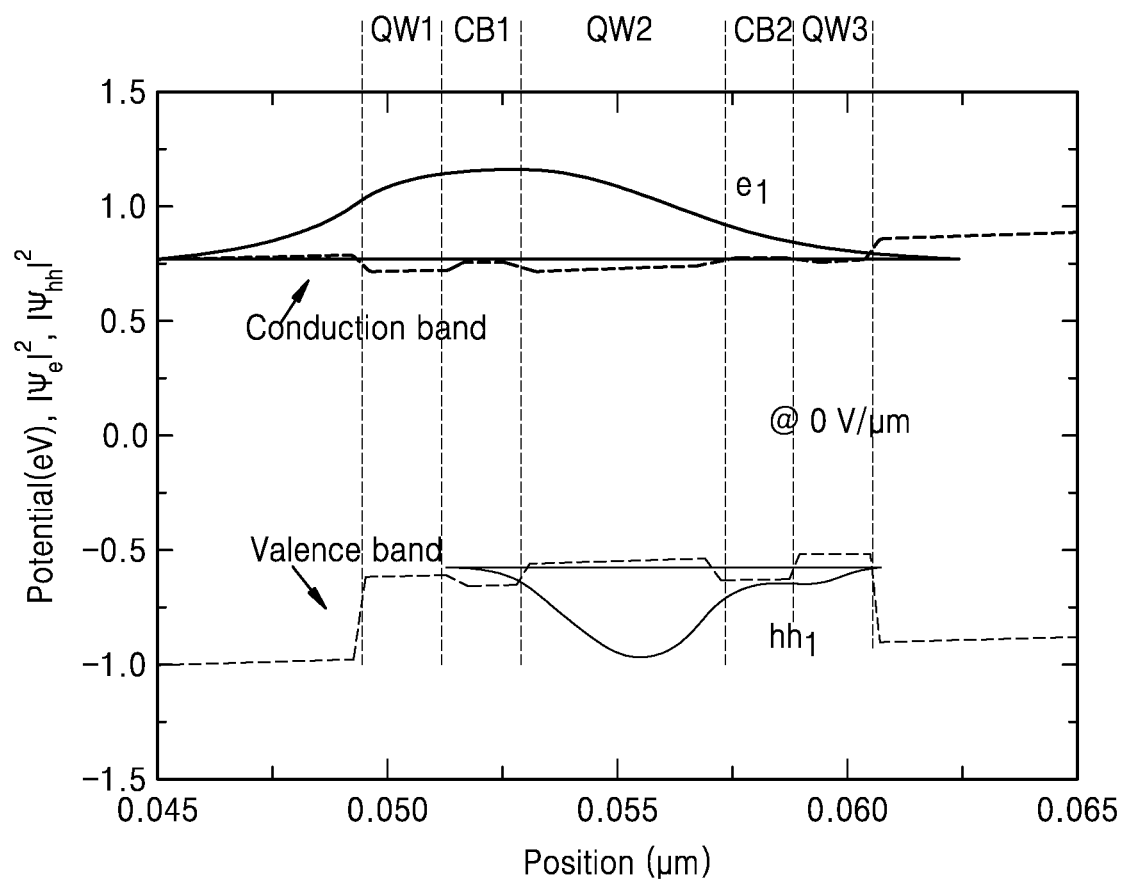
FIGS. 6A, 6B, and 6C are graphs respectively showing changes in a wave function of electrons and a wave function of holes with respect to a voltage applied to an active layer shown in FIG. 5.
Figure 6B:
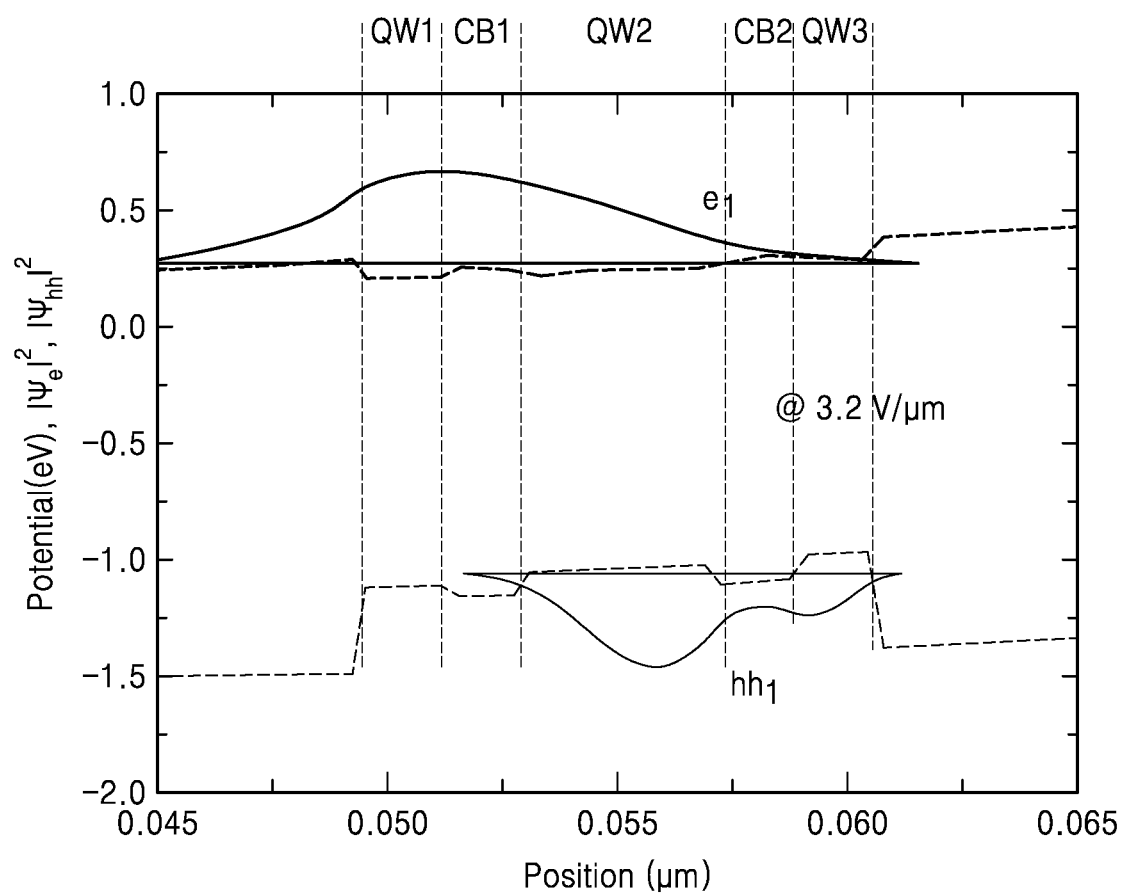
Figure 6C:
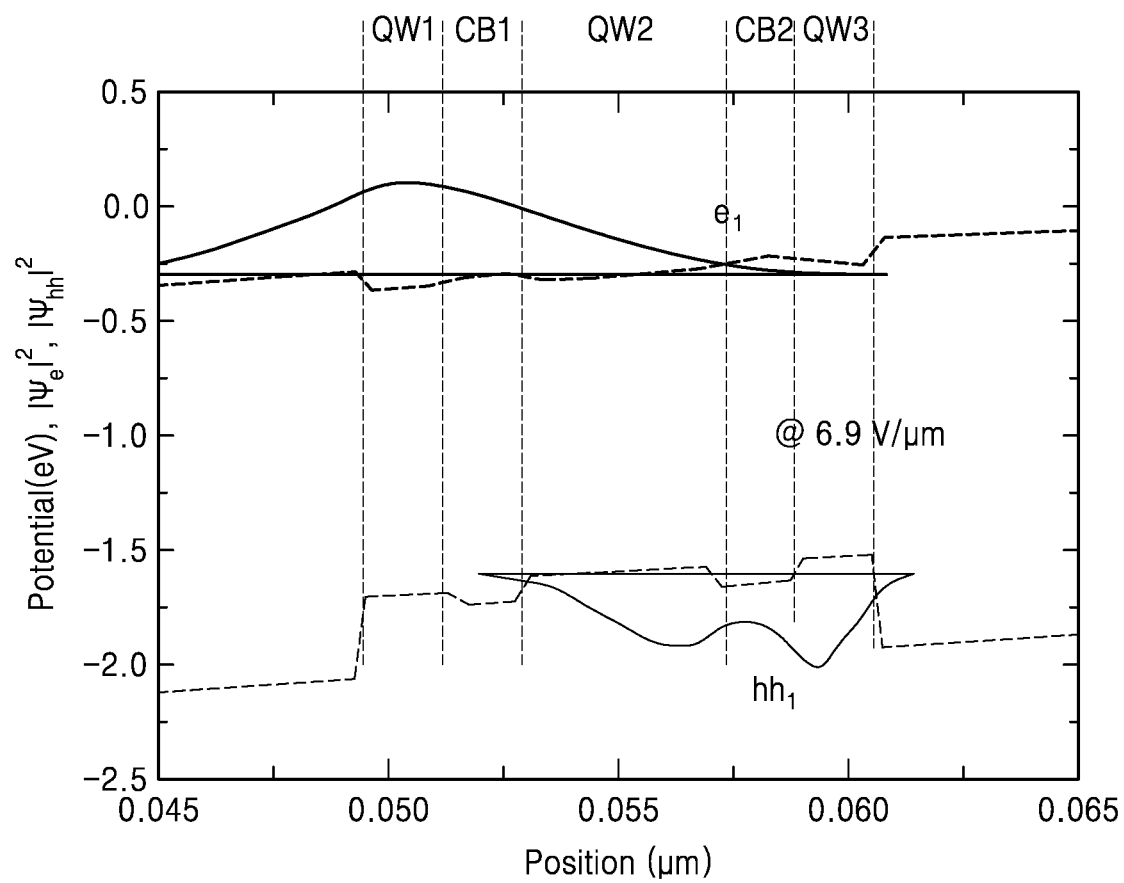

FIGS. 6A, 6B, and 6C are graphs respectively showing changes in a wave function of electrons and a wave function of holes with respect to a voltage applied to the active layer shown in FIG. 5. In particular, FIG. 6A illustrates a wave function of electrons and a wave function of holes when a reverse bias voltage is not applied to the active layer shown in FIG. 5, and FIG. 6B illustrates a wave function of electrons and a wave function of holes when a reverse bias voltage of about 3.2 V/μm is applied to the active layer. FIG. 6C illustrates a wave function of electrons and a wave function of holes when a reverse bias voltage of about 6.9 V/μm is applied to the active layer. In FIGS. 6A through 6C, $IN_{0.08}GaAs$ is used for the first quantum well layer QW1, $In_{0.137}GaAs$ is used for the second quantum well layer QW2, and $In_{0.15}GaAs$ is used for the third quantum well layer QW3. GaAs is used for the first and second coupling barriers CB1 and CB2.

Referring to FIGS. 6A through 6C, when a voltage is not applied to an active layer, the wave function of the first electron e1 is distributed across the first, second, and third quantum well layers QW1, QW2, and QW3, and the wave function of the first heavy hole hh1 is distributed mainly in the second quantum well layer QW2. When the voltage is applied to the active layer, the wave function of the first electron e1 moves toward the first quantum well layer QW1 beyond the first coupling barrier CB1, and the wave function of the first heavy hole hh1 moves toward the third quantum well layer QW3 beyond the second coupling barrier CB2. In particular, when the graph of FIG. 6C is compared with the graphs of FIGS. 2C and 4, because the band gaps sequentially decrease from the first quantum well layer QW1 to the second quantum well layer QW2 and then to the third quantum well layer QW3 in the active layer in FIG. 5, the first heavy hole hh1 moves faster toward the third quantum well layer QW3 when the voltage is applied to the active layer, thereby further increasing the degree to which the first heavy hole $hh_1$ is confined to the third quantum well layer QW3. Consequently, the first heavy hole hh1 may sufficiently move toward the third quantum well layer QW3 at a lower voltage in the active layer shown in FIG. 5 and the driving voltage for the optical device including the active layer shown in FIG. 5 may be further lowered.

Figure 7A:
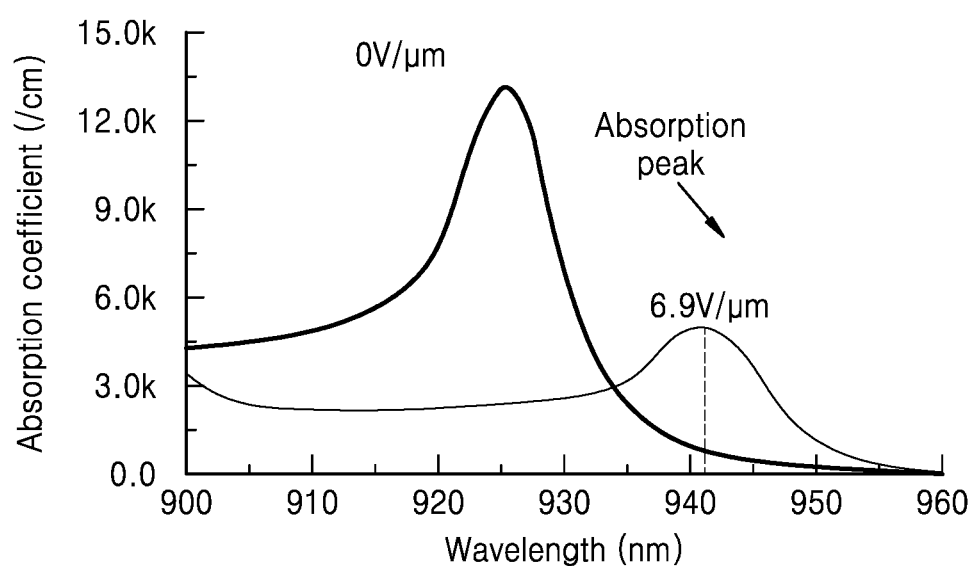
FIGS. 7A, 7B, and 7C are graphs respectively showing an absorption spectrum in an active layer according to a comparative example and in active layers shown in FIGS. 1 and 5.
Figure 7B:
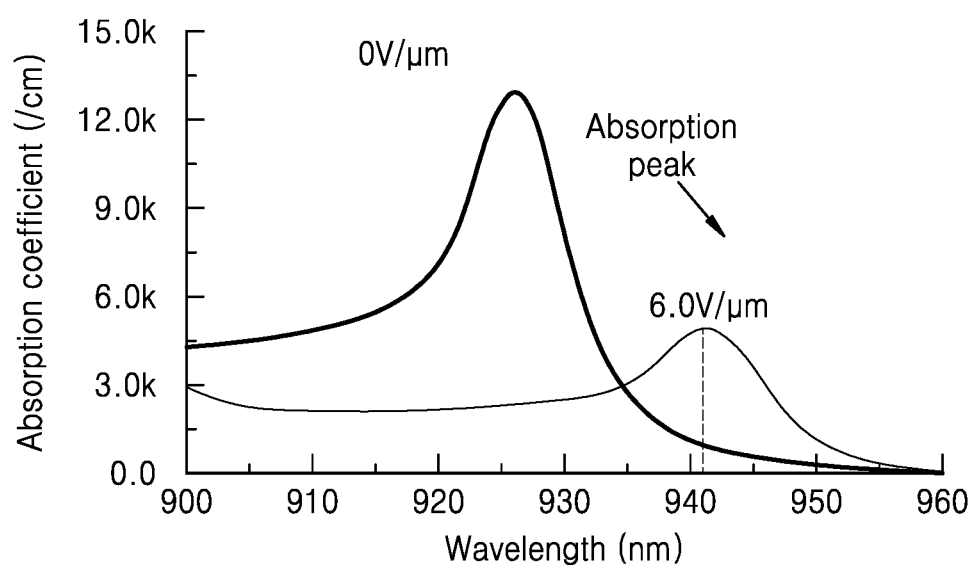
Figure 7C:
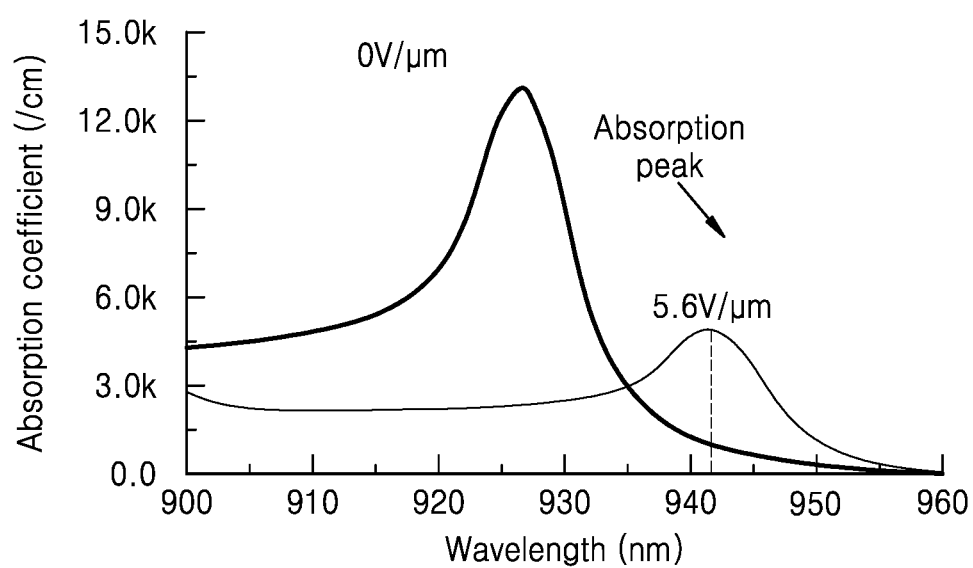

FIGS. 7A, 7B, and 7C are graphs respectively showing an absorption spectrum in an active layer according to a comparative example and in the active layers shown in FIGS. 1 and 5. FIG. 7A shows an absorption spectrum of the active layer according to the comparative example, FIG. 7B shows an absorption spectrum of the active layer shown in FIG. 1, and FIG. 7C shows an absorption spectrum of the active layer shown in FIG. 5.

Referring to FIG. 7A, when an applied external electric field is 0 V/μm, the highest peak is generated at a wavelength of about 926 nm. The highest peak may be caused by an exciton pair (e.g., e1-hh1) of the first electron e1 and the first heavy hole hh1. At a wavelength of about 940 nm, an absorption coefficient is very small such that majority of light having the wavelength of about 940 nm passes through the active layer. As the applied external electric field increases, the absorption spectrum shows reduction in absorption intensity while the highest peak is moved toward a longer wavelength based on the Stark effect. When the applied external electric field is about 6.9 V/μm, the absorption spectrum has the highest peak at a wavelength of about 940 nm, and has a lower peak when compared to an applied external electric field of about 0 V/μm. Thus, when the active layer according to the comparative example is used, the driving voltage of the optical device that operates with respect to light having a wavelength of about 940 nm is about 6.9 V/μm.

On the other hand, referring to FIG. 7B, when a voltage of about 6.0 V/μm is applied to the active layer shown in FIG. 1, the absorption spectrum is moved to have the highest peak at a wavelength of about 940 nm. Referring to FIG. 7C, when a voltage of about 5.6 V/μm is applied to the active layer shown in FIG. 5, the absorption spectrum is moved to have the highest peak at a wavelength of about 940 nm. Thus, when the active layer shown in FIG. 1 is used, the driving voltage of the optical device that operates with respect to light having a wavelength of about 940 nm is about 6.0 V/μm, and when the active layer shown in FIG. 5 is used, a driving voltage of the optical device that operates with respect to the light having a wavelength of about 940 nm is about 5.6 V/μm, thereby reducing the driving voltage of the optical device when compared to the case of using the active layer according to the comparative example.

Figure 8:
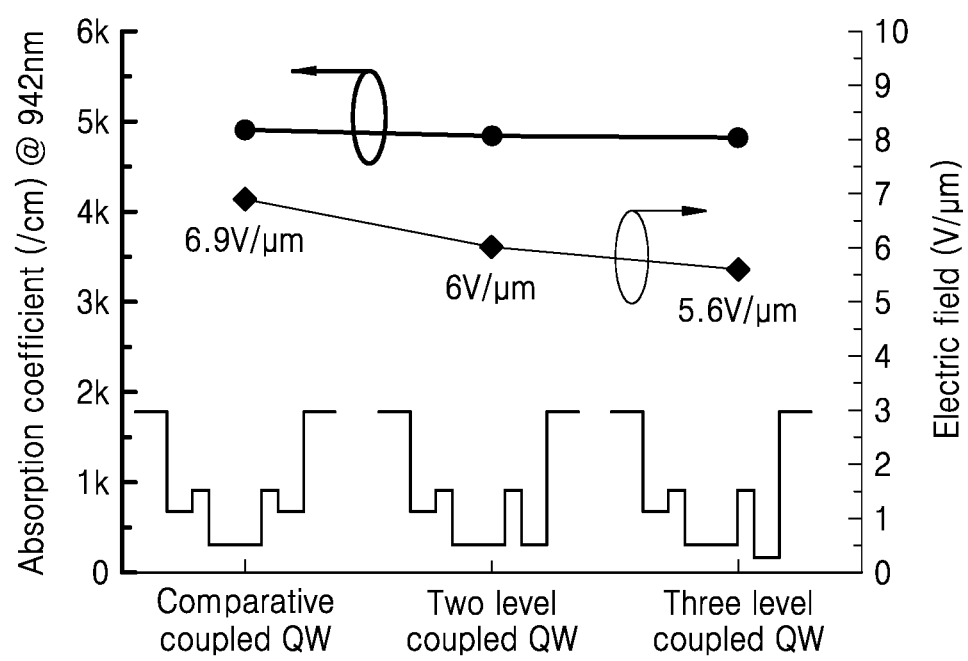
FIG. 8 is a graph showing an absorption coefficient and a driving voltage in an active layer according to a comparative example and in active layers shown in FIGS. 1 and 5.

FIG. 8 is a graph showing an absorption coefficient and a driving voltage in an active layer according to a comparative example and in the active layers shown in FIGS. 1 and 5.

Referring to FIG. 8, an absorption coefficient of the active layers shown in FIGS. 1 and 5 is substantially equal to or similar to that of the active layer according to the comparative example, however, a driving voltage of the active layers shown in FIGS. 1 and 5 is lower than that of the active layer according to the comparative example. The absorption coefficient is based on normalization of an area in which a wave function of an electron and a wave function of a hole overlap each other, and when the degree to which the wave function of the electron and the wave function of the hole overlap each other is large, generation of excitons corresponding to pairs of electrons and holes increases, thereby increasing the absorption coefficient. As described above with reference to FIGS. 2A through 2C and FIGS. 6A through 6C, according to the exemplary embodiments, the majority part of the wave function of the electron and the majority part of the wave function of the hole may remain in the large-thickness second quantum well layer QW2 such that the degree to which the wave function of the electron and the wave function of the hole overlap each other may be large.

Figure 9:
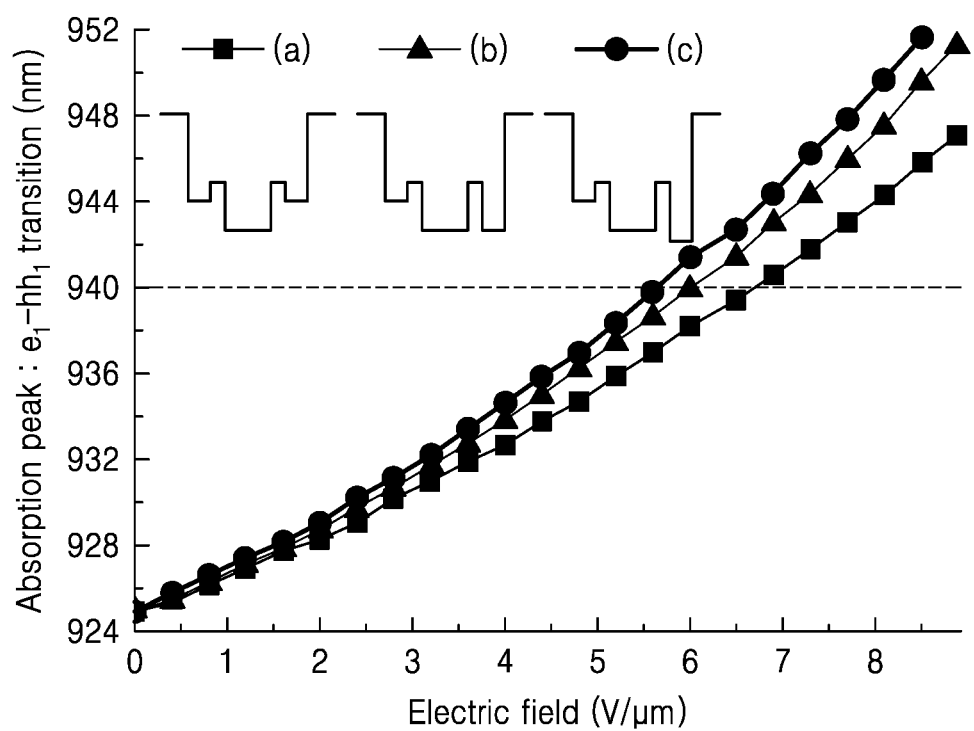
FIG. 9 is a graph showing a change of an absorption peak with respect to an applied voltage in an active layer according to a comparative example and a change of an absorption peak with respect to an applied voltage in active layers shown in FIGS. 1 and 5.

FIG. 9 is a graph showing a change (a) of an absorption peak with respect to an applied voltage in an active layer according to a comparative example, a change (b) of an absorption peak with respect to an applied voltage in active layers shown in FIG. 1, and a change (c) of an absorption peak with respect to an applied voltage in an active layer shown in FIG. 5.

As shown in FIG. 9, when an applied external electric field is about 0 V/μm (or when a voltage is not applied to the active layer), the absorption peaks with respect to the active layer according to the comparative example and the active layers shown in FIGS. 1 and 5 are about 925 nm. When a voltage is applied to the active layer, the active layer according to the exemplary embodiments has higher transition energy than the comparative example such that the absorption spectrum may quickly move toward a longer wavelength. Thus, the absorption spectrum may reach about 940 nm at a lower voltage according to the exemplary embodiments compared with the comparison example. For example, the absorption spectrum (a) of the active layer according to the comparative example reaches about 940 nm at about 6.9 V/μm, the absorption spectrum (b) of the active layer shown in FIG. 1 reaches about 940 nm at about 6.0 V/μm, and the absorption spectrum (c) of the active layer shown in FIG. 5 reaches about 940 nm at about 5.6 V/μm.

Thus, the optical device including the active layer having the three-coupled quantum well structure with asymmetric multi-level energy according to the exemplary embodiments may achieve improved light absorption characteristics and lower driving voltage than a related art optical device. The optical device according to the exemplary embodiments is applicable to not only an optical modulator, but also a semiconductor device having various P-I-N diode structures to absorb light in a particular wavelength band. For example, the exemplary embodiments may be applied to an optical filter, a photodiode, a solar battery, a light-emitting element, an optical communication system, optical interconnection, an optical calculator, and so forth.

Figure 10:
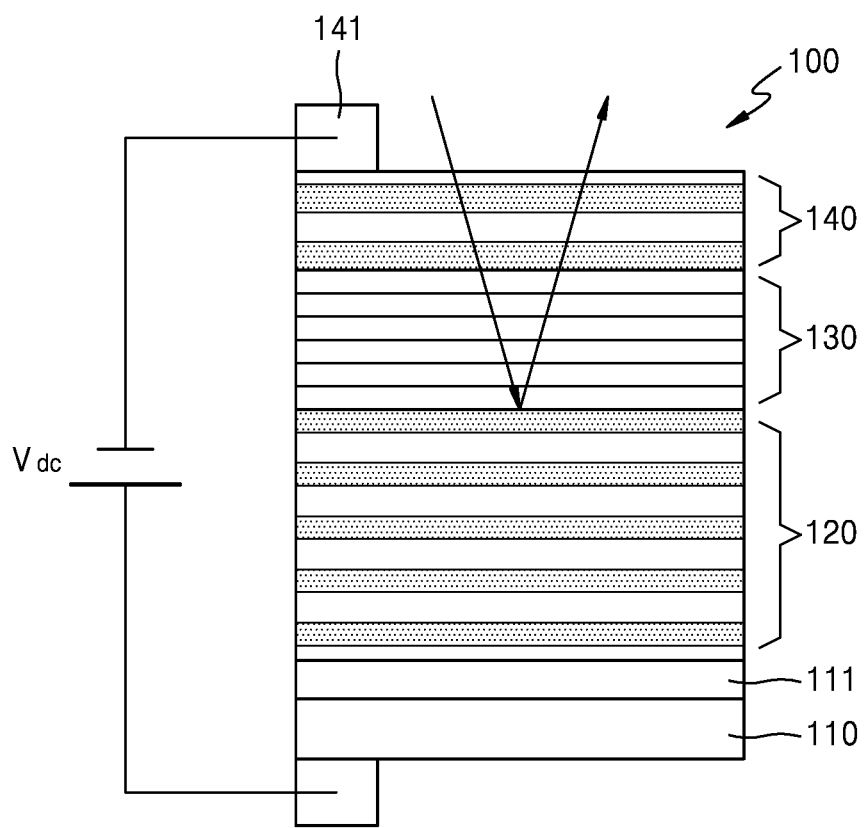
FIG. 10 schematically illustrates a reflective optical modulator including a three-coupled quantum well structure according to an exemplary embodiment.

FIG. 10 schematically illustrates a reflective optical modulator 100 including a three-coupled quantum well structure according to an exemplary embodiment.

Referring to FIG. 10, the reflective optical modulator 100 may include a substrate 110, a first contact layer 111 disposed on the substrate 110, a lower reflective layer 120 disposed on the first contact layer 111, an active layer 130 disposed on the lower reflective layer 120, an upper reflective layer 140 disposed on the active layer 130, and a second contact layer 141 disposed on the upper reflective layer 140. The upper reflective layer 140 and the lower reflective layer 120 may be doped to serve as a reflective layer and an electric path at the same time. For example, the first contact layer 111 and the lower reflective layer 120 may be N-type doped, and the upper reflective layer 140 and the second contact layer 141 may be P-type doped. The active layer 130 is not doped. Accordingly, the reflective optical modulator 100 shown in FIG. 10 has a P-I-N diode structure. For example, the substrate 110 may include GaAs and the first contact layer 111 may include n-GaAs.

The reflective optical modulator 100 reflects incident light while absorbing a part of the incident light depending on an electric signal, and modulates the intensity of reflected light. To reflect the incident light, the lower reflective layer 120 is formed to have a reflectance of about 90% or higher, and the upper reflective layer 140 is formed to have a reflectance of about 30% to about 50%. The lower reflective layer 120 and the upper reflective layer 140 may be a distributed Bragg reflector (DBR) in which a low-refractive-index layer having a lower refractive index and a high-refractive-index layer having a higher refractive index are alternately stacked repeatedly. In this structure, reflection occurs on an interface between two layers having different refractive indices (e.g., the low-refractive-index layer and the high-refractive-index layer), and by using the same phase difference for all of reflected lights, a high reflectance may be obtained. To this end, optical thicknesses (e.g., a product of a physical thickness and a refractive index of a layer material) of the low-refractive-index layer and the high-refractive-index layer in each of the lower reflective layer 120 and the upper reflective layer 140 may be about an odd-numbered multiple of $\lambda/4$ (e.g., $\lambda$ indicates a resonance wavelength of the reflective optical modulator 100).

Moreover, a reflectance of the lower reflective layer 120 and the upper reflective layer 140 may be adjusted as desired depending on the number of pairs of the low-refractive-index layer and the high-refractive-index layer stacked. For example, the lower reflective layer 120 may include n-$Al_{0.87}Ga_{0.13}As$ in the low-refractive-index layer and n-$Al_{0.20}Ga_{0.80}As$ in the high-refractive-index layer, and the upper reflective layer 140 may include p-$Al_{0.87}Ga_{0.13}As$ in the low-refractive-index layer and p-$Al_{0.20}Ga_{0.80}As$ in the high-refractive-index layer.

The active layer 130 absorbs light and has a multi-quantum well layer structure in which the aforementioned three-coupled quantum well structure having asymmetric multi-level energy and the outer barriers are repetitively stacked. The active layer 130 may serve as a main cavity for Fabry-Perot resonance. To this end, the active layer 130 may be formed to have an optical thickness of about an integral multiple of $\lambda/2$.

When a voltage $V_{dc}$ is applied, the active layer 130 according to the exemplary embodiment has higher transition energy such that the absorption spectrum may quickly move toward a longer wavelength.

Figure 11:
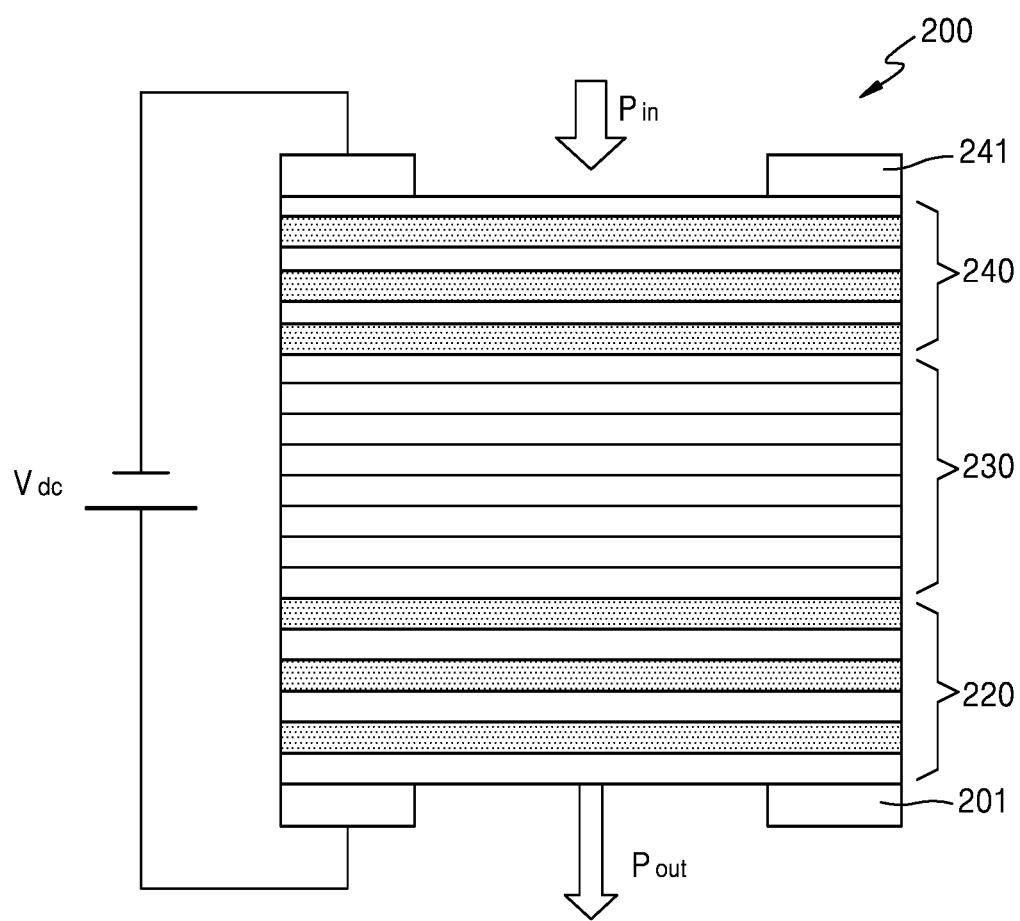
FIG. 11 schematically illustrates a transmissive optical modulator including a three-coupled quantum well structure according to an exemplary embodiment.

FIG. 11 schematically illustrates a transmissive optical modulator 200 including a three-coupled quantum well structure according to an exemplary embodiment.

Referring to FIG. 11, the transmissive optical modulator 200 may include a lower reflective layer 220, an active layer 230 disposed on the lower reflective layer 220, an upper reflective layer 240 disposed on the active layer 230, a first contact layer 201 disposed on a side of the lower reflective layer 220, and a second contact layer 241 disposed on a side of the upper reflective layer 240. The first contact layer 201 and the second contact layer 241 may be partially disposed on the side of the lower reflective layer 220 and the side of the upper reflective layer 240, respectively. The first contact layer 201 and the second contact layer 241 may be formed in the shape of a ring along circumferences of the lower reflective layer 220 and the upper reflective layer 240 to pass light therethrough.

Although not shown in FIG. 11, a substrate may be formed on the transmissive optical modulator 200 and then may be removed from the transmissive optical modulator 200. To allow light to pass through the substrate, the substrate may be partially removed (e.g., only a central portion of the substrate may be removed). As described above, the upper reflective layer 240 and the lower reflective layer 220 may be doped to serve a reflective layer and an electric path at the same time.

The transmissive optical modulator 200 passes at least a part of incident light $P_{in}$ therethrough and absorbs at least a part of the incident light $P_{in}$ depending on an electric signal to modulate the intensity of light $P_{out}$ passed through the transmissive optical modulator 200. The lower reflective layer 220 and the upper reflective layer 240 pass at least a part of the incident light therethrough and reflect at least a part of light to allow resonance in the active layer 230 that is the main cavity. In the transmissive optical modulator 200, the lower reflective layer 220 and the upper reflective layer 240 may have the same reflectance equal to about 50%. The active layer 230 may have a multi-quantum well layer structure in which the three-coupled quantum well structure having asymmetric multi-level energy shown in FIG. 1 or 5 and the outer barriers are stacked repeatedly.

When a voltage $V_{dc}$ is applied, the active layer 230 according to the exemplary embodiment has higher transition energy such that the absorption spectrum may quickly move toward a longer wavelength.

Figure 12:
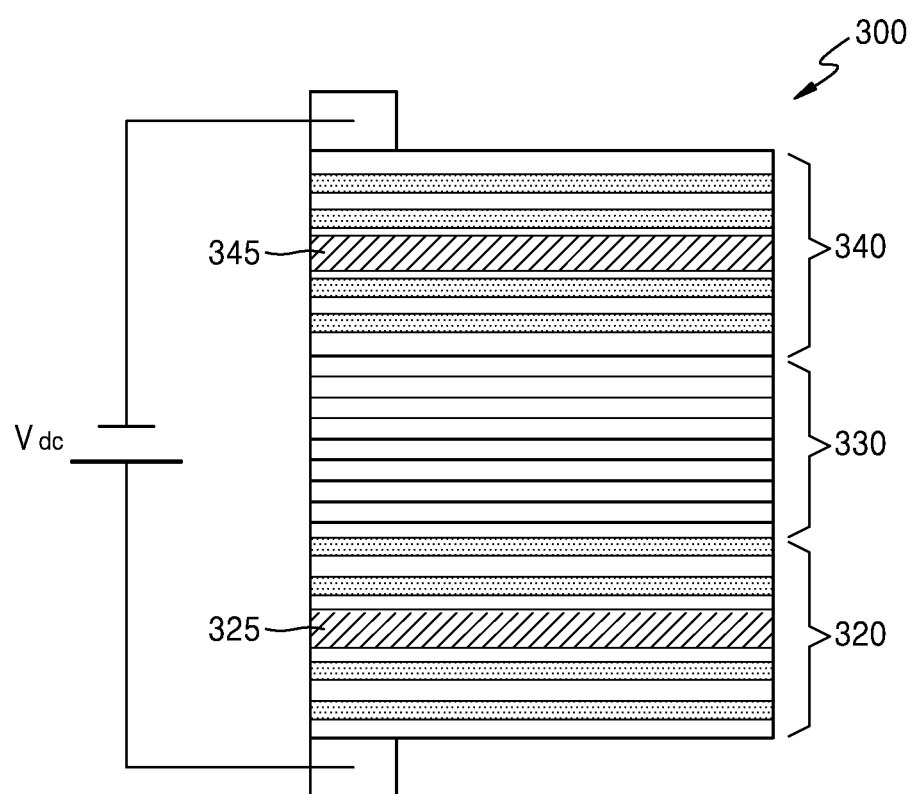
FIG. 12 schematically illustrates a transmissive optical modulator including a three-coupled quantum well structure according to another exemplary embodiment.

FIG. 12 schematically illustrates a transmissive optical modulator 300 including a three-coupled quantum well structure according to another exemplary embodiment. The transmissive optical modulator 300 shown in FIG. 12 may have a broader bandwidth than the transmissive optical modulator 200 shown in FIG. 11.

Referring to FIG. 12, the transmissive optical modulator 300 may include a lower reflective layer 320, an active layer 330 disposed on the lower reflective layer 320, an upper reflective layer 340 disposed on the active layer 330, a first micro cavity layer 325 disposed in the lower reflective layer 320, and a second micro cavity layer 345 disposed in the upper reflective layer 340. The active layer 330 may be a main cavity for Fabry-Perot resonance, and the first micro cavity layer 325 and the second micro cavity layer 345 serve as additional cavities for Fabry-Perot resonance. To this end, the optical thicknesses of the micro cavity layers 325 and 345 may be equal to about an integral multiple of λ/2. The first and second micro cavity layers 325 and 345 may include a high-refractive-index layer material or a low-refractive-index layer material to be used in the lower and upper reflective layers. The first and second micro cavity layers 325 and 345 may be respectively disposed on the lower reflective layer 320 and the upper reflective layer 340, but any one of the first and second micro cavity layers 325 and 345 may be omitted.

Although not explicitly shown in FIG. 12, corresponding quantum well layers in the active layer 330 may have different thicknesses to increase a bandwidth. For example, by changing the thickness of the second quantum well layer QW2 in which the wave function of the hole and the wave function of the electron overlap each other, two or more types of the second quantum well layers QW2 having different thicknesses may be formed. By adding the first and second micro cavity layers 325 and 345 and changing the thicknesses of the second quantum well layers QW2, an absorption intensity may increase and a light absorption bandwidth of the transmissive optical modulator 300 may be improved.

Figure 13:
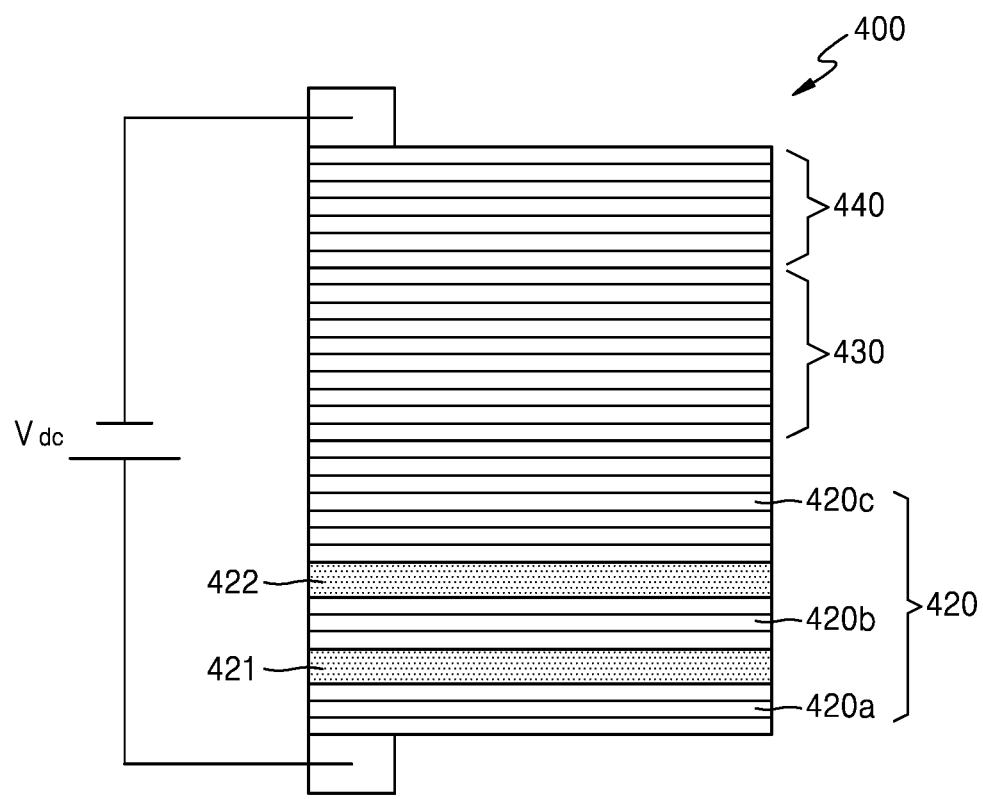
FIG. 13 schematically illustrates a transmissive optical modulator including a three-coupled quantum well structure according to another exemplary embodiment.

FIG. 13 schematically illustrates a transmissive optical modulator 400 including a three-coupled quantum well structure according to another exemplary embodiment.

Referring to FIG. 13, the transmissive optical modulator 400 may include a lower reflective layer 420, an active layer 430 disposed on the lower reflective layer 420, an upper reflective layer 440 disposed on the active layer 430, and a first micro cavity layer 421 and a second micro cavity layer 422 disposed in the lower reflective layer 420. The transmissive optical modulator 400 shown in FIG. 13 is different from the transmissive optical modulator 300 shown in FIG. 12 in that the first micro cavity layer 421 and the second micro cavity layer 422 are disposed in the lower reflective layer 420, and no micro cavity layer is disposed in the upper reflective layer 440.

The lower reflective layer 420 may be divided into three parts by the first micro cavity layer 421 and the second micro cavity layer 422. For example, the lower reflective layer 420 may include a first lower reflective layer 420a under the first micro cavity 421, a second lower reflective layer 420b between the first micro cavity 421 and the second micro cavity 422, and a third lower reflective layer 420c on the second micro cavity 422. Each of the first lower reflective layer 420a, the second lower reflective layer 420b, and the third lower reflective layer 420c may include a pair of one or more high-refractive-index layers and low-refractive-index layers. The active layer 430 may include a multi-quantum well layer structure in which the three-coupled quantum well structure having asymmetric multi-level energy shown in FIG. 1 or 5 and the outer barriers are repeatedly stacked.

Figure 14A:
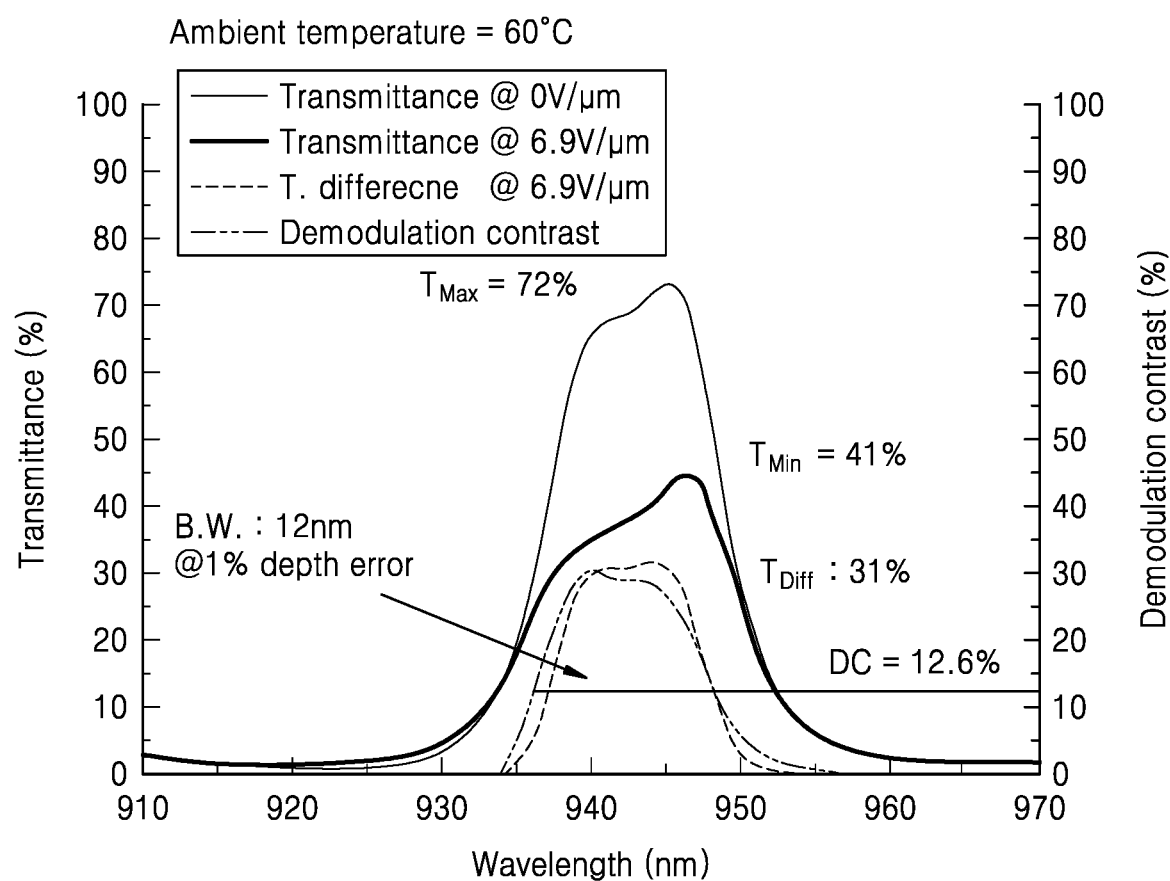
FIGS. 14A, 14B, and 14C are graphs respectively showing transmittance characteristics when an optical modulator illustrated in FIG. 13 uses an active layer according to a comparative example and when the optical modulator illustrated in FIG. 13 uses active layers shown in FIGS. 1 and 5.
Figure 14B:
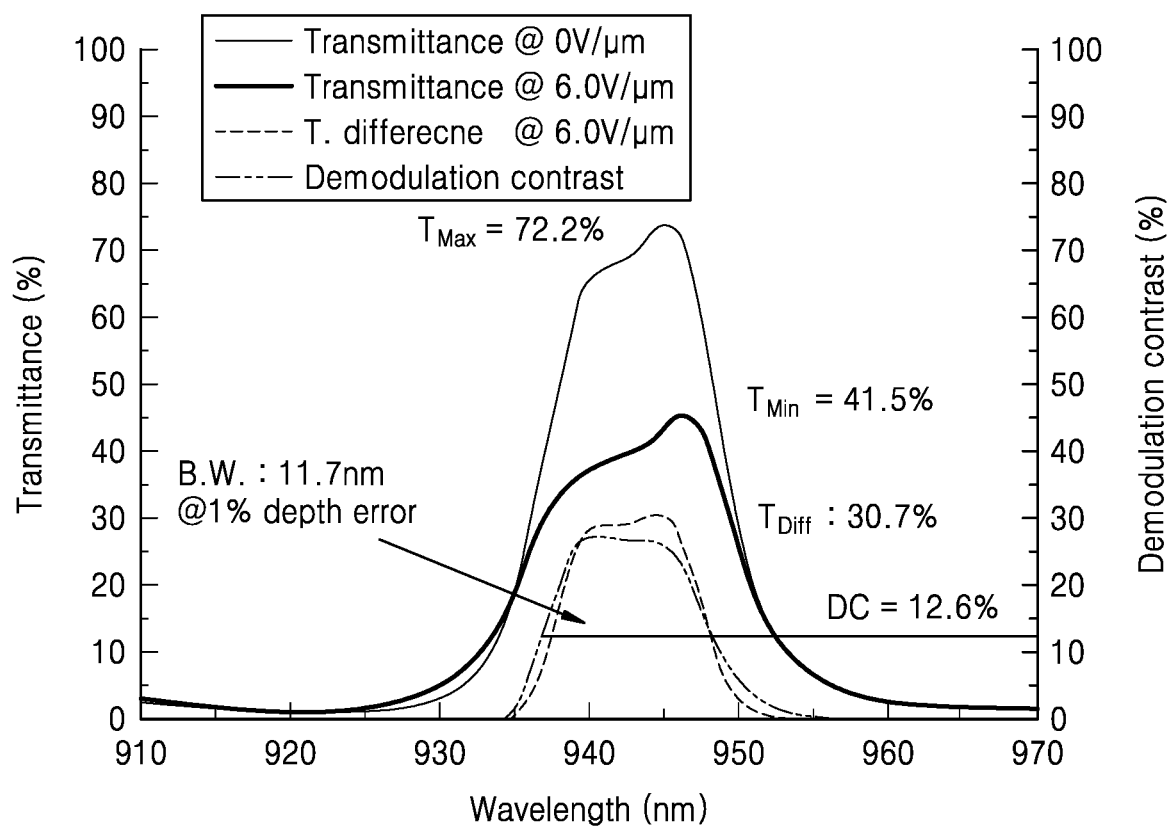
Figure 14C:
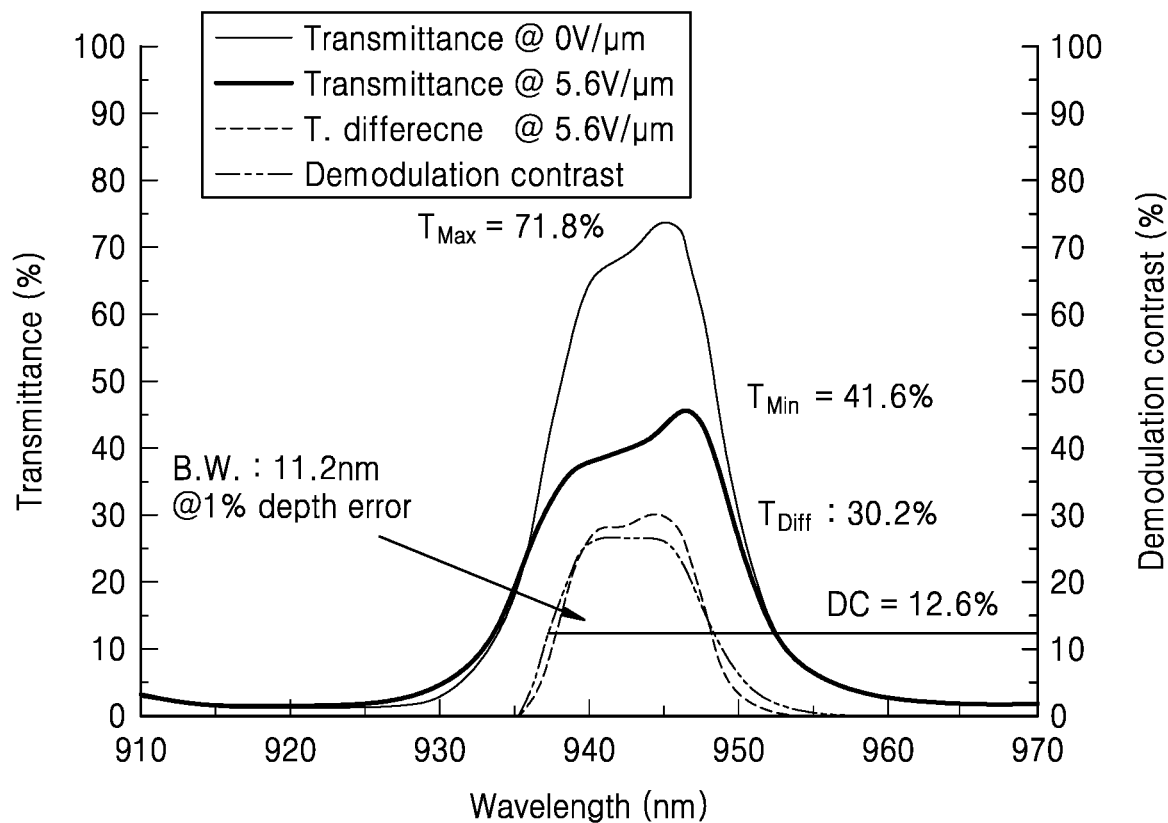

FIGS. 14A, 14B, and 14C are graphs respectively showing transmittance characteristics when the optical modulator 400 illustrated in FIG. 13 uses an active layer according to a comparative example and when the optical modulator 400 uses the active layers shown in FIGS. 1 and 5. FIG. 14A is a graph when the active layer according to the comparative example is used, FIG. 14B is a graph when the active layer shown in FIG. 1 is used, and FIG. 14C is a graph when the active layer shown in FIG. 5 is used.

In FIG. 14A, GaAsP having a thickness of 5.8 nm is used for an outer barrier, GaAs having a thickness of 1.5 nm is used for the first coupling barrier CB1 and the second coupling barrier CB2, $In_{0.08}GaAs$ having a thickness of about 2.0 nm is used for the first quantum well layer QW1 and the third quantum well layer QW3, and $In_{0.137}GaAs$ having a thickness of 4.8 nm is used for the second quantum well layer QW2. In the graph of FIG. 14B, GaAsP having a thickness of 6.0 nm is used for the outer barrier, GaAs having a thickness of 1.5 nm is used for the first coupling barrier CB1 and the second coupling barrier CB2, $In_{0.08}GaAs$ having a thickness of 2.0 nm is used for the first quantum well layer QW1, $In_{0.137}GaAs$ having a thickness of 4.8 nm is used for the second quantum well layer QW2, and $In_{0.137}GaAs$ having a thickness of 2.0 nm is used for the third quantum well layer QW3. In the graph of FIG. 14C, GaAsP having a thickness of 6.1 nm is used for the outer barrier, GaAs having a thickness of 1.5 nm is used for the first coupling barrier CB1 and the second coupling barrier CB2, $In_{0.08}GaAs$ having a thickness of 2.0 nm is used for the first quantum well layer QW1, $In_{0.137}GaAs$ having a thickness of 4.8 nm is used for the second quantum well layer QW2, and $In_{0.15}GaAs$ having a thickness of 2.0 nm is used for the third quantum well layer QW3.

Referring to FIG. 14A, a thin solid line indicates a transmittance when a voltage is not applied and corresponds to a left vertical axis, and a thick solid line indicates a transmittance when a reverse bias voltage of 6.9 V is applied and corresponds to the left vertical axis. A dotted line indicates a transmittance difference between when a voltage is not applied and when a voltage is applied, and corresponds to the left vertical axis. A two-dot chain line indicates a demodulation contrast (DC) and corresponds to a right vertical axis.

As shown in FIG. 14A, a transmittance difference $T_{Diff}$ between when a voltage is not applied and when a voltage is applied at a wavelength of about 940 nm is about 31%. A bandwidth having a DC of about 12.6% or more is about 12 nm. Herein, the DC may be defined as $(T_{max}-T_{min})/(T_{max}+T_{min})$, wherein $T_{max}$ denotes a maximum transmittance and $T_{min}$ denotes a minimum transmittance.

Referring to FIG. 14B, a thin solid line indicates a transmittance when a voltage is not applied and corresponds to the left vertical axis, and a thick solid line indicates a transmittance when a reverse bias voltage of 6.0 V is applied and corresponds to the left vertical axis. A dotted line indicates a transmittance difference between when a voltage is not applied and when a voltage is applied, and corresponds to the left vertical axis. A two-dot chain line indicates a demodulation contrast (DC) and corresponds to a right vertical axis. A transmittance difference at a wavelength of about 940 nm is about 30.7%, and a bandwidth having a DC of about 12.6% or more is about 11.7 nm.

Referring to FIG. 14C, a thin solid line indicates a transmittance when a voltage is not applied and corresponds to the left vertical axis, and a thick solid line indicates a transmittance when a reverse bias voltage of 5.6 V is applied and corresponds to the left vertical axis. A dotted line indicates a transmittance difference between when a voltage is not applied and when a voltage is applied, and corresponds to the left vertical axis. A two-dot chain line indicates a demodulation contrast (DC) and corresponds to a right vertical axis. A transmittance difference at a wavelength of about 940 nm is about 30.2%, and a bandwidth having a DC of about 12.6% or more is about 11.2 nm. Thus, a transmittance difference and a bandwidth which are main optical characteristics of an optical modulator are maintained substantially constant as shown in FIGS. 14A through 14C, and a driving voltage is reduced in a case shown in FIG. 14B and also in a case shown in FIG. 14C, compared to the comparative example as shown in FIG. 14A.

Figure 15:
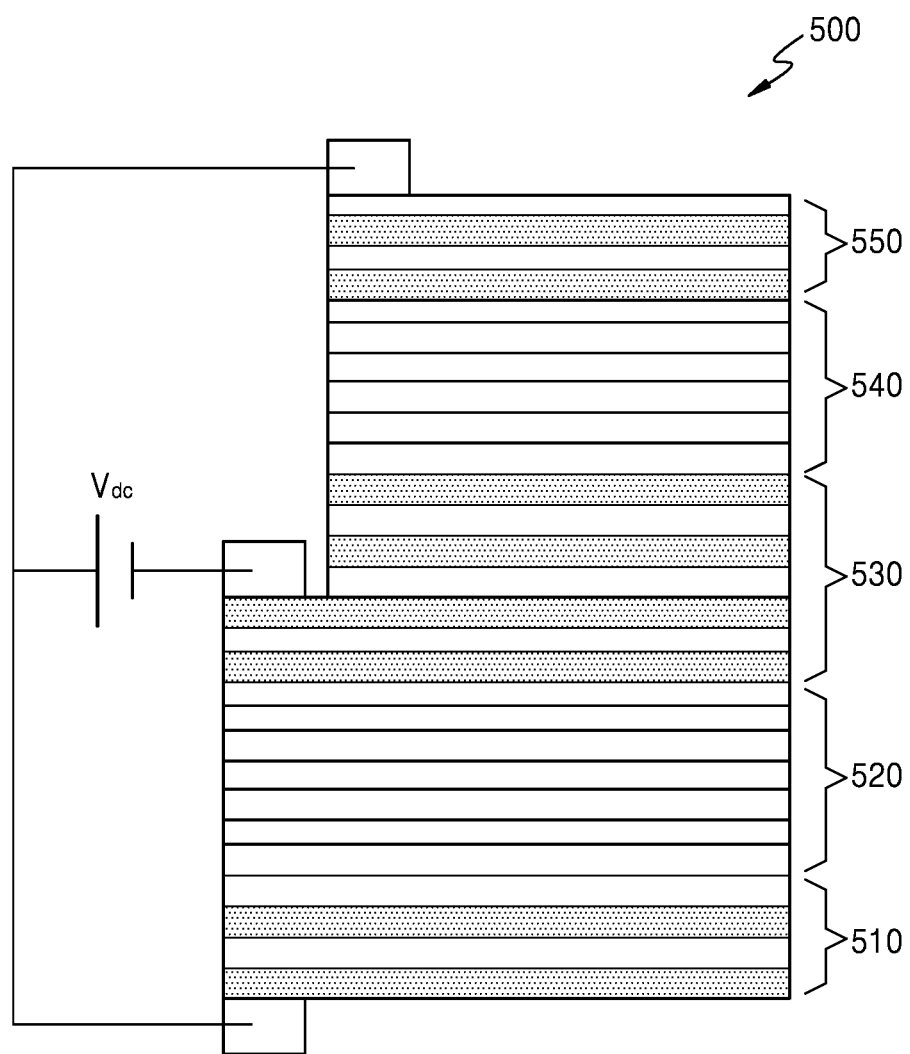
FIG. 15 schematically illustrates a transmissive optical modulator including a three-coupled quantum well structure according to another exemplary embodiment.

FIG. 15 schematically illustrates a transmissive optical modulator 500 including a three-coupled quantum well structure according to another exemplary embodiment.

Referring to FIG. 15, the transmissive optical modulator 500 may include a lower reflective layer 510, a first active layer 520 disposed on the lower reflective layer 510, an intermediate reflective layer 530 disposed on the first active layer 520, a second active layer 540 disposed on the intermediate reflective layer 530, and an upper reflective layer 550 disposed on the second active layer 540. Herein, the lower reflective layer 510 and the upper reflective layer 550 may be doped as the same electric type, and the intermediate reflective layer 530 may be doped as an electric type that is opposite to those of the lower reflective layer 510 and the upper reflective layer 550. For example, the lower reflective layer 510 and the upper reflective layer 550 may be doped as the N type and the intermediate reflective layer 530 may be doped as the P type. On the other hand, the lower reflective layer 510 and the upper reflective layer 550 may be doped as the P type and the intermediate reflective layer 530 may be doped as the N type. Thus, the transmissive optical modulator 500 shown in FIG. 15 may have an N-I-P-I-N or P-I-N-I-P structure.

Accordingly, the transmissive optical modulator 500 may be regarded as having a stacked diode structure in which two diodes are electrically connected in parallel. Generally, a driving voltage of an optical modulator is proportional to a total thickness of an active layer (or a total number of quantum well layers in the active layer). However, in the transmissive optical modulator 500 according to the exemplary embodiment, the two active layers 520 and 540 are electrically connected in parallel such that a driving voltage for the transmissive optical modulator 500 may be reduced to about a half when compared to an optical modulator having one active layer having a thickness equal to a sum of thicknesses of the two active layers 520 and 540. Thus, power consumption may be further reduced, thereby avoiding performance degradation of the transmissive optical modulator 500 caused by heat emission.

Moreover, according to the exemplary embodiment, by differently forming the three-coupled quantum well structure of the first active layer 520 and the three-coupled quantum well structure of the second active layer 540, the bandwidth of the transmissive optical modulator 500 may be improved. In other words, in a multi-resonance mode where the resonance wavelength of the first active layer 520 and the resonance wavelength of the second active layer 540 are different from each other, the absorption intensity increases such that the light absorption bandwidth of the transmissive optical modulator 500 may be improved. For example, a thickness of the second quantum well layer QW2 in the three-coupled quantum well structure of the first active layer 520 may be different from a thickness of the second quantum well layer QW2 in the three-coupled quantum well structure of the second active layer 540. The first active layer 520 may have the three-coupled quantum well structure shown in FIG. 1, and the second active layer 540 may have the three-coupled quantum well structure shown in FIG. 5. For example, in the first active layer 520, the first quantum well layer QW1 may have a first energy band gap and the second quantum well layer QW2 and the third quantum well layer QW3 may have a second energy band gap that is smaller than the first energy band gap. In the second active layer 540, the first quantum well layer QW1 may have the first energy band gap, the second quantum well layer QW2 may have the second energy band gap that is smaller than the first energy band gap, and the third quantum well layer QW3 may have the third energy band gap that is smaller than the second energy band gap.

Although a few embodiments have been shown and described, it would be appreciated by those skilled in the art that changes may be made in exemplary embodiments without departing from the principles and spirit of the disclosure, the scope of which is defined in the claims and their equivalents.

What is claimed is:

1. An optical device comprising:
   an active layer comprising two outer barriers and a coupled quantum well between the two outer barriers, wherein the coupled quantum well comprises:
   a first quantum well layer;
   a second quantum well layer;
   a third quantum well layer;
   a first coupling barrier between the first quantum well layer and the second quantum well layer; and
   a second coupling barrier between the second quantum well layer and the third quantum well layer,
   wherein the second quantum well layer is between the first quantum well layer and the third quantum well layer,
   wherein an energy band gap of the second quantum well layer is less than an energy band gap of the first quantum well layer, an energy band gap of the third quantum well layer is equal to or less than the energy band gap of the second quantum well layer, and the energy band gap of the third quantum well layer is less than the energy band gap of the first quantum well layer, and
   wherein the first, the second, and the third quantum well layers comprise $In_xGa_{1-x}As$ ($0<x\leq0.2$), a value of the composition ratio (x) of the first quantum well layer being less than a value of the composition ratio (x) of the second quantum well layer and less than a value of the composition ratio (x) of the third quantum well layer, and the value of the composition ratio (x) of the second quantum well layer being equal to or less than the value of the composition ratio (x) of the third quantum well layer.

2. The optical device of claim 1, wherein the energy band gap of the third quantum well layer is less than the energy band gap of the second quantum well layer.

3. The optical device of claim 1, wherein a thickness of the first quantum well layer and a thickness of the third quantum well layer are less than a thickness of the second quantum well layer.

4. The optical device of claim 3, wherein the thickness of the first quantum well layer is equal to the thickness of the third quantum well layer.

5. The optical device of claim 3, wherein the thickness of the first quantum well layer and the thickness of the third quantum well layer are in a range from about 1 nm to about 2 nm, and the thickness of the second quantum well layer is in a range from about 4 nm to about 8 nm.

6. The optical device of claim 1, wherein an energy band gap of the first coupling barrier and an energy band gap of the second coupling barrier are greater than the energy band gaps of the first, the second, and the third quantum well layers and are less than an energy band gap of an outer barrier.

7. The optical device of claim 1, wherein a thickness of the first coupling barrier allows tunneling of an electron and a hole through the first coupling barrier and a thickness of the second coupling barrier allows the tunneling of the electron and the hole through the second coupling barrier.

8. The optical device of claim 7, wherein the thickness of the first coupling barrier and the thickness of the second coupling barrier are in a range from about 1 nm to about 3 nm.

9. The optical device of claim 1, wherein the first and the second coupling barriers comprise GaAs, and an outer barrier comprises at least one of $GaAs_yP_{1-y}$, $In_yGa_{1-y}P$ ($0.4 \leq y \leq 0.5$).

10. The optical device of claim 1, further comprising a substrate,
wherein each of the first, the second, and the third quantum well layers comprises a material having a compressive strain with respect to the substrate, and an outer barrier comprises a material having a tensile strain with respect to the substrate.

11. The optical device of claim 1, further comprising:
a lower reflective layer under the active layer and doped in a first conductive type; and
an upper reflective layer on the active layer and doped in a second conductive type that is electrically opposite to the first conductive type.

12. The optical device of claim 11, further comprising:
at least one micro cavity layer in at least one of the lower reflective layer or the upper reflective layer
wherein when a resonance wavelength of the optical device is $\lambda$, an optical thickness of the active layer and an optical thickness of the at least one micro cavity layer are each an integral multiple of $\lambda/2$.

13. The optical device of claim 11, wherein the optical device comprises a reflective optical modulator, and a reflectance of the lower reflective layer is greater than a reflectance of the upper reflective layer.

14. The optical device of claim 11, wherein the optical device comprises a transmissive optical modulator, and a reflectance of the lower reflective layer is equal to a reflectance of the upper reflective layer.

15. The optical device of claim 1, wherein the active layer comprises a first active layer and a second active layer.

16. The optical device of claim 15, further comprising:
a lower reflective layer under the first active layer and doped in a first conductive type;
an intermediate reflective layer between the first active layer and the second active layer and doped in a second conductive type that is electrically opposite to the first conductive type; and
an upper reflective layer on the second active layer and doped in the first conductive type.

17. The optical device of claim 15, wherein a thickness of the second quantum well layer of the coupled quantum well of the first active layer is different from a thickness of the second quantum well layer of the coupled quantum well of the second active layer.

18. The optical device of claim 15, wherein the energy band gap of the third quantum well layer is equal to the energy band gap of the second quantum well layer in the first active layer, and the energy band gap of the third quantum well layer is less than the energy band gap of the second quantum well layer in the second active layer.

19. The optical device of claim 1, wherein a band gap of the first quantum well layer is in a range from about 1.5 eV to about 1.2 eV, a band gap of the second quantum well layer is in a range from about 1.3 eV to about 1.1 eV, and a band gap of the third quantum well layer is about 1.3 eV or less.

20. An optical device comprising:
an active layer comprising two outer barriers and a coupled quantum well between the two outer barriers,
wherein the coupled quantum well comprises:
a first quantum well layer;
a second quantum well layer;
a third quantum well layer;
a first coupling barrier between the first quantum well layer and the second quantum well layer; and
a second coupling barrier between the second quantum well layer and the third quantum well layer,
wherein an energy band gap of the first coupling barrier and an energy band gap of the second coupling barrier are greater than energy band gaps of the first, the second, and the third quantum well layers and are less than an energy band gap of an outer barrier,
wherein the first quantum well layer has a first energy band gap, the second quantum well layer has a second energy band gap less than the first energy band gap, and the third quantum well layer has a third energy band gap less than the first energy band gap, and
wherein the first, the second, and the third quantum well layers comprise $In_xGa_{1-x}As$ ($0<x\leq0.2$), a value of the composition ratio (x) of the first quantum well layer being less than a value of the composition ratio (x) of the second quantum well layer and less than a value of the composition ratio (x) of the third quantum well layer, and the value of the composition ratio (x) of the second quantum well layer being equal to or less than the value of the composition ratio (x) of the third quantum well layer.

21. The optical device of claim 20, wherein the third energy band gap of the third quantum well layer is less than the second energy band gap.

* * * * *